(12) United States Patent
Hasegawa

(10) Patent No.: US 6,580,152 B2
(45) Date of Patent: Jun. 17, 2003

(54) SEMICONDUCTOR WITH PLURAL SIDE FACES

(75) Inventor: Kiyoshi Hasegawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/045,099

(22) Filed: Jan. 15, 2002

(65) Prior Publication Data

US 2003/0038343 A1 Feb. 27, 2003

(30) Foreign Application Priority Data

Aug. 21, 2001 (JP) ........................................ 2001-250483

(51) Int. Cl.[7] .............................................. H01L 23/48
(52) U.S. Cl. ........................ 257/618; 257/620; 257/730
(58) Field of Search ................................. 257/680, 730, 257/678, 618, 620, 623; 174/52.2; 361/717, 730, 820

(56) References Cited

U.S. PATENT DOCUMENTS

| 4,670,770 A | * | 6/1987 | Tai .............................. 357/60 |
| 5,019,943 A | * | 5/1991 | Fassbender et al. ........ 361/396 |
| 6,020,603 A | * | 2/2000 | Tokunoh et al. ............ 257/171 |
| 6,049,124 A | * | 4/2000 | Raiser ......................... 257/712 |
| 6,091,130 A | * | 7/2000 | Oyamatsu et al. .......... 257/619 |
| 2001/0011772 A1 | | 8/2001 | Fukasawa et al. |

FOREIGN PATENT DOCUMENTS

| JP | 05087949 | | 11/1993 | |
| JP | 06232255 A | | 8/1994 | |
| JP | 09063993 A | | 3/1997 | |
| JP | 09320911 A | | 12/1997 | |
| JP | 10308410 A | | 11/1998 | |
| JP | 11260974 A | | 9/1999 | |
| JP | 2001203177 | * | 7/2001 | ................. 257/648 |

* cited by examiner

Primary Examiner—Kamand Cuneo
Assistant Examiner—Lourdes Cruz
(74) Attorney, Agent, or Firm—Rabin & Berdo, P.C.

(57) ABSTRACT

A semiconductor device includes a semiconductor substrate which has a first main surface having circuit elements formed thereon, a second main surface substantially opposite to the first main surface, and a plurality of side faces provided between the first main surface and the second main surface. The semiconductor device also includes a plurality of external terminals formed over the first main surface and respectively electrically connected to the circuit elements. The second main surface has a central area and a peripheral area surrounding the central area, and a first steplike section formed in the peripheral area.

35 Claims, 18 Drawing Sheets

SEMICONDUCTOR WITH PLURAL SIDE FACES

BACKGROUND OF THE INVENTION

1. Field of the Invention

The present invention relates to a semiconductor device and a method for manufacturing the same. The present invention particularly relates to a semiconductor device having a semiconductor chip whose back is exposed, and a method for manufacturing the same.

This application is the counterpart of Japanese patent application, Serial Number 250483/2001, filed Aug. 21, 2001, the subject matter of which is incorporated herein by reference.

2. Description of the Related Art

With size reductions in portable devices, there has been a demand for a reduction in the size of semiconductor devices in the portable devices. In order to meet such a demand, a semiconductor device called a "Chip Size Package" having outside dimensions approximately identical to those of a semiconductor chip has come along. As one form of the chip size package, there is known a semiconductor device called a "Wafer Level Chip Size Package" or "Wafer Level Chip Scale Package". In such a wafer level chip size package (hereinafter called "WCSP"), the surface of a semiconductor chip (semiconductor substrate) is sealed with a resin, whereas the back (silicon surface) thereof has an exposed structure.

Such a WCSP is mounted on a printed circuit board so that the surface side of the semiconductor chip is placed face to face with the printed circuit board. Namely, the WCSP is placed on the printed circuit board in a state in which the back of the semiconductor chip is being turned up.

Thereafter, a visual inspection is effected on the WCSP placed on the printed circuit board. As items intended for the visual inspection, there may be mentioned, for example, a position inspection and a height inspection. The position inspection is carried out to check whether the WCSP is placed in a predetermined position on the printed circuit board. The height inspection is made to check whether the WCSP is placed aslant to the surface of the printed circuit board.

A device using a laser beam is known as a visual inspecting device for executing the above-described visual inspection. This type of visual inspecting device carries out the following operations.

A laser beam emitted from a laser light source mounted to the visual inspecting device is first applied to the printed circuit board and an electronic part (WCSP) to be inspected. The irradiated laser beam is reflected by the printed circuit board and the electronic part (WCSP), and a light detecting or receiving device attached to the visual inspecting device receives such a reflected laser beam. The printed circuit board is shifted in an X-axis direction or a Y-axis direction to thereby carry out a series of operations for the application and reception of the laser beam. Namely, the laser beam scans over the electronic part (WCSP) and the printed circuit board. The visual inspecting device measures the difference between the intensity of the laser beam applied from the laser light source and the intensity of the laser beam received by the light receiving device during the series of operations. Thus, the visual inspecting device recognizes the outer shape (contour) of the electronic part (WCSP). The visual inspecting device executes the position and height inspections, based on the result of recognition.

In the WCSP, however, the back (silicon surface) of the semiconductor chip is ground to further thin the thickness of the WCSP and due to reasons such as the difference between the linear expansion coefficient of silicon and that of the printed circuit board. Therefore, the silicon surface thereof is held in a mirror state. When the laser beam is applied to the WCSP having such a silicon surface held in the mirror state and the printed circuit board as described above, the difference between the intensity of light reflected by the printed circuit board and returned to the light receiving device and the intensity of light reflected by the WCSP and returned to the light receiving device is small, i.e., the contrast is low. Therefore, the visual inspecting device had difficulty in recognizing the outer shape (contour) of the WCSP. Accordingly, the visual inspecting device has encountered difficulties in determining whether the WCSP is placed in the predetermined position on the printed circuit board or mounted aslant to the surface of the printed circuit board.

Thus there has been a demand for a semiconductor device that makes it easy to perform a visual or optical inspection.

SUMMARY OF THE INVENTION

It is an object of the present invention is to provide a semiconductor device having improved structure for performing an easy visual inspection.

According to one aspect of the present invention, there is provided a semiconductor device that includes a semiconductor substrate which has a first main surface having circuit elements formed thereon, a second main surface substantially opposite to the first main surface, and a plurality of side faces provided between the first main surface and the second main surface. The semiconductor device also includes a plurality of external terminals formed over the first main surface and respectively electrically connected to the circuit elements. The second main surface has a central area and a peripheral area surrounding the central area, and a first steplike section formed in the peripheral area.

The above and further objects and novel features of the invention will more fully appear from the following detailed description appended claims and the accompanying drawings.

DETAILED DESCRIPTION OF THE PREFERRED EMBODIMENTS

Figure 1:
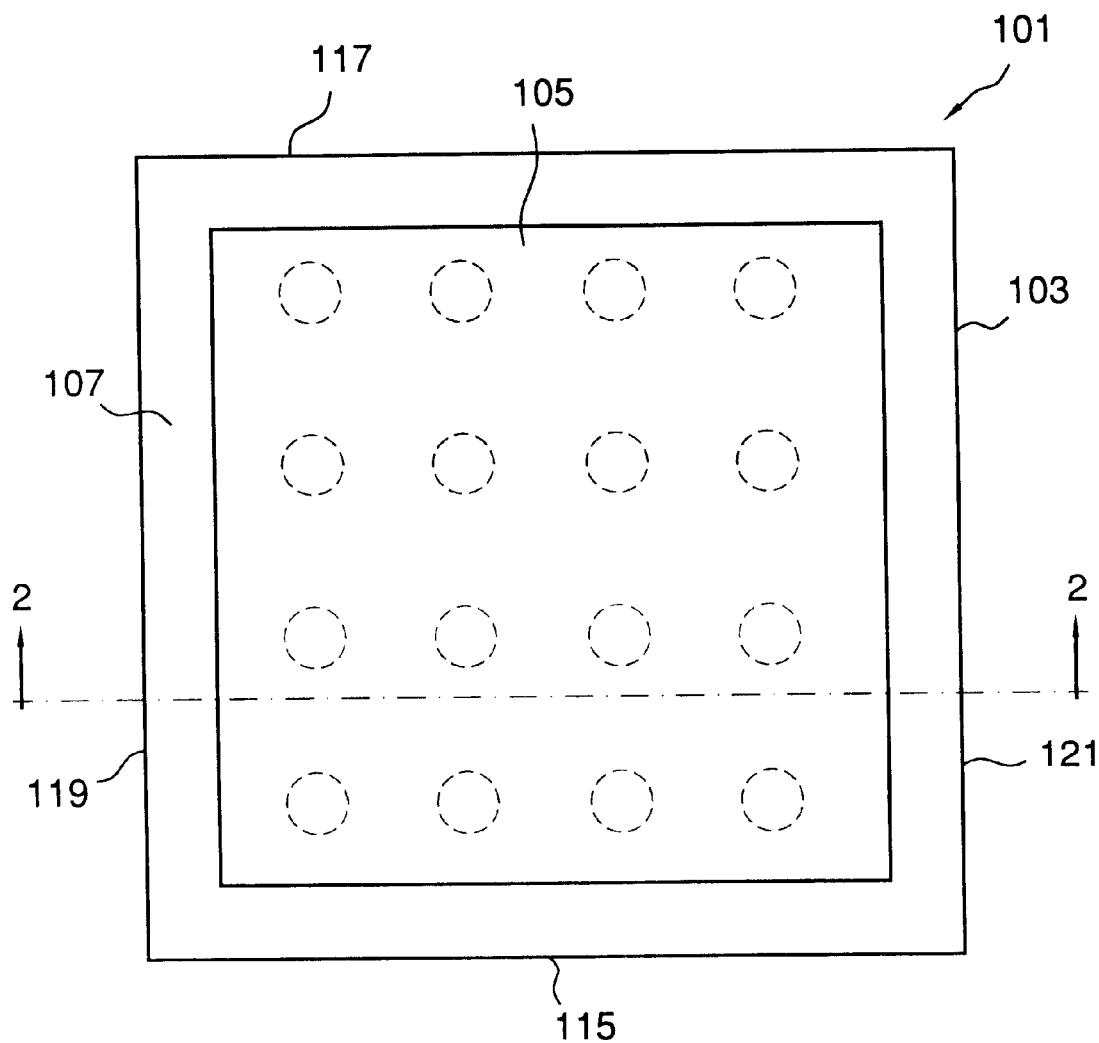
FIG. 1 is a plan perspective view showing the back of a semiconductor device 101 according to a first embodiment of the present invention.

A semiconductor device according to preferred embodiments of the present invention will be explained hereinafter with reference to the figures. In order to simplify the explanation, like elements are given like or corresponding reference numerals through this specification and figures. Dual explanations of the same elements are avoided.

First Preferred Embodiment

Figure 2:
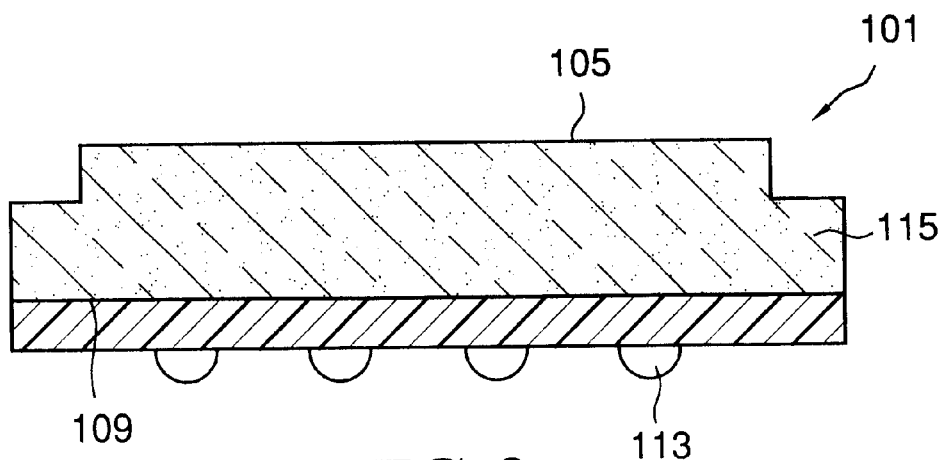
FIG. 2 is a schematic cross-sectional view taken along line 2—2 of FIG. 1.

FIG. 1 is a plan perspective view showing the back of a semiconductor device 101 according to a first embodiment of the present invention, and FIG. 2 is a schematic cross-sectional view taken along line 2—2 of FIG. 1, respectively.

The semiconductor device 101 corresponds to the WCSP as mentioned previously. The semiconductor device 101 has a semiconductor substrate 103 (also called a "semiconductor chip"), a sealing resin 111, and a plurality of protruded electrodes 113.

As shown in FIGS. 1 and 2, the semiconductor device 101 has outer dimensions approximately identical to those of the semiconductor chip. In the present embodiment, the semiconductor device 101 is shaped in the form of a substantially quadrangle whose one side is 8 mm, for example.

The semiconductor substrate 103 has a surface 109 (first main surface) with circuit elements formed thereon, a reverse side or back 105 (second main surface) substantially opposite to the surface 109, and a plurality of side faces which connect between the surface 109 and the back 105. Further, the semiconductor substrate 103 as a steplike section 107 (also called a "concave portion or trench") formed in the back 105. The steplike section 107 indicates a characteristic portion of the present invention. The steplike section 107 is formed in a peripheral area which surrounds a central area of the back 105. Namely, the steplike section 107 is formed along a first side face 115, a second side face 117 opposite to the first side face 115, and a third side face 119 and a fourth side face 121 adjacent to the first side face 115 and the second side face 117. Here, the term of "along the side faces" means that the steplike section 107 is formed in the back 105 with the side faces as starting points, or some of the side faces are chipped off to form the steplike section 107 in the back 105.

The sealing resin 111 is formed on the surface 109 of the semiconductor substrate 103 and has the function of protecting unillustrated circuit elements formed on the surface 109 from external environments.

The plurality of protruded electrodes 113 are respectively formed on unillustrated posts formed inside the sealing resin 111 and electrically connected to their corresponding circuit elements formed on the semiconductor substrate 103 by means of the posts. These protruded electrodes 113 serve as external terminals of the semiconductor device 101. Incidentally, the posts will be described in detail later.

Figure 3:
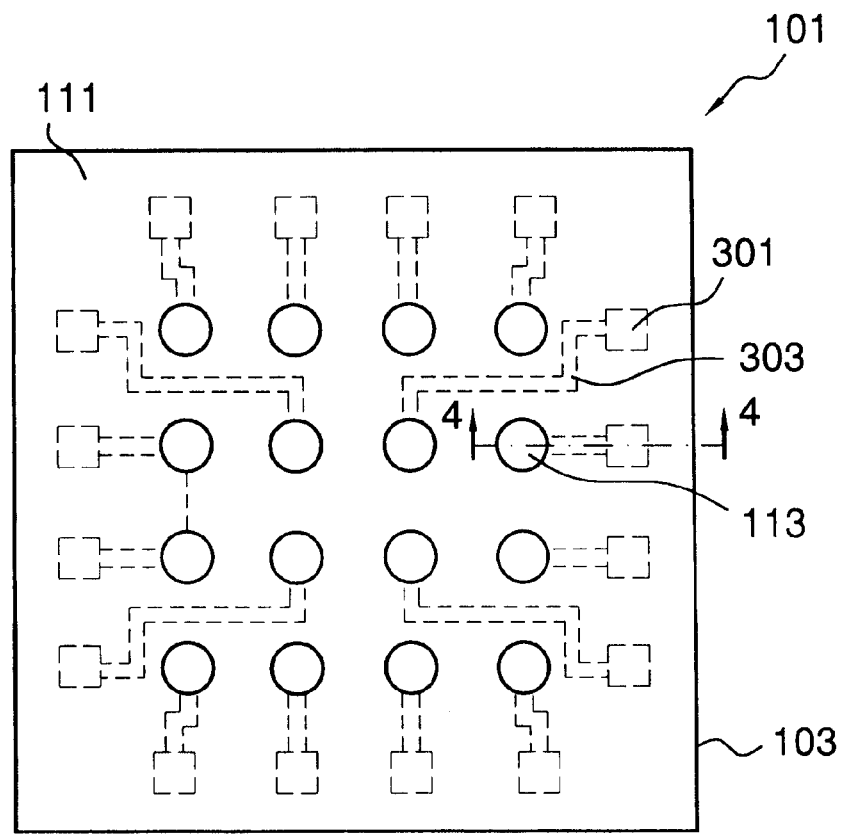
FIG. 3 is a plan perspective view illustrating the surface of the semiconductor device 101 according the first embodiment of the present invention.
Figure 4:
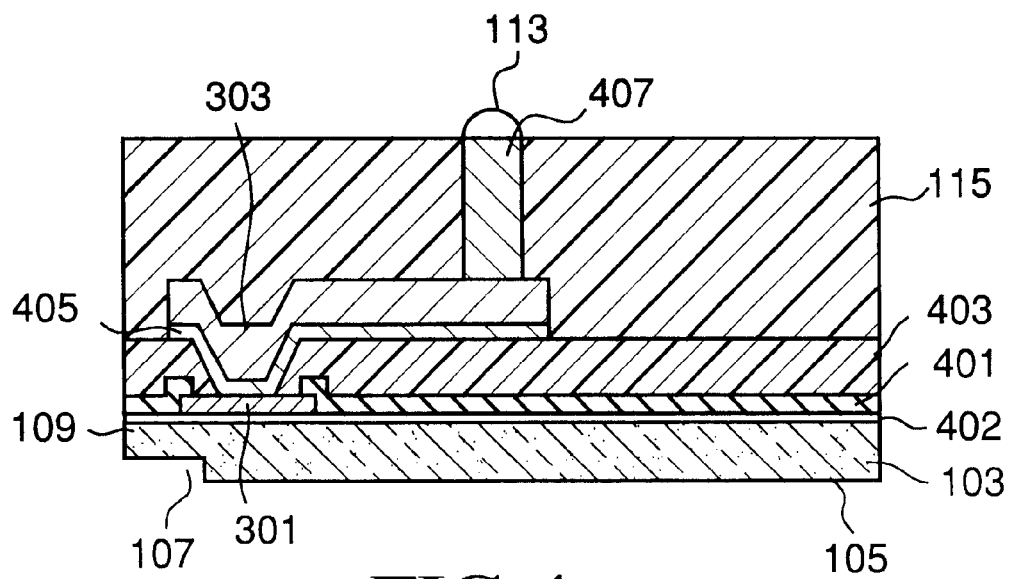
FIG. 4 is a detailed cross-sectional view taken along line 4—4 of FIG. 3.

FIG. 3 is a plan perspective view showing the surface of the semiconductor device 101 according to the first embodiment of the present invention, and FIG. 4 is a detailed cross-sectional view taken along line 4—4 of FIG. 3, respectively.

Electrode pads 301, metal wiring layers 303 and protruded electrodes 113 are illustrated in FIG. 3. Since the electrode pads 301 and the metal wiring layers 303 are located below the sealing resin 111, they are indicated by dotted lines respectively.

As shown in FIG. 3, the sixteen electrode pads 301 are provided in a peripheral area of the surface 109 of the semiconductor substrate 103 at intervals of 100 µm, for example.

The sixteen protruded electrodes 113 are disposed in matrix form on a central area of the surface 109 of the semiconductor substrate 103. The respective protruded electrodes 113 are electrically connected to their corresponding metal wiring layers 303 via unillustrated posts.

The metal wiring layers 303 performs the function of substantially shifting the positions of external terminals from a peripheral portion of the semiconductor substrate 103 to a central area of the semiconductor substrate 103. In general, such shift is called "relocation". Therefore, the metal wiring layers 303, which perform such shift, are called "relocating wirings or rewirings". They may also be known as "re-distribution" conductors. Placing the protruded electrodes 113 serving as the external terminals in the central area of the semiconductor substrate 103 in this way allows a size reduction in the printed circuit board connected to the semiconductor device 101.

A configuration of the semiconductor device 101 will next be described in more detail by using FIG. 4.

Unillustrated plural circuit elements are formed on a surface 109 (first main surface) of a semiconductor substrate 103 made up of silicon. A steplike section 107 is provided at the back 105 (second main surface) of the semiconductor substrate 103. An insulating layer 402 having contact holes (not shown) is formed over the respective circuit elements. An unillustrated conductive layer is formed inside each contact hole.

An electrode pad 301 is formed on the insulating layer 402. The electrode pad 301 is connected to its corresponding circuit element through the conductive layer formed inside the contact hole. The electrode pad 301 is made up of aluminum containing silicon, for example.

A passivation film 401 is formed over the insulating layer 402 and a peripheral edge portion of the electrode pad 301. The passivation film 401 comprises silicon nitride, for example.

An interlayer insulator or dielectric 403 is formed over the passivation film 401. The interlayer dielectric 403 has the function of relaxing stress applied to the semiconductor substrate 103. The interlayer dielectric 403 is made up of polyimide, for example. Incidentally, the surface of the interlayer dielectric 403 located just below a metal thin-film layer 405 to be described later changes in quality. A thick line indicates an area in which the surface thereof has changed in quality. The existence of the interlayer dielectric 403 whose surface has changed in quality, yields an improvement in adhesion between the interlayer dielectric 403 and the metal thin-film layer 405.

The metal thin-film layer 405 is formed over the interlayer dielectric 403 and the electrode pad 301. The metal thin-film layer 405 may be either a single layer or a complex layer but may preferably be formed of a complex layer comprising an upper layer and a lower layer. The lower film may be a material high in adhesion to the electrode pad 301 and capable of preventing a substance constituting the upper film from diffusing into the semiconductor substrate 103 side. The lower film is made of titanium, for example. The upper film may be a material high in adhesion to the metal wiring layer 303 formed thereabove. The upper film comprises copper, for example.

The metal wiring layer 303 is formed on the metal thin-film layer 405. The metal wiring layer 303 is made of copper, for example.

A post 407 is formed on the surface of the metal wiring layer 303. In the illustrated example, the post 407 is shaped in the form of a substantially cylinder. The bottom face of the post 407 makes contact with the surface of the metal wiring layer 303, and the top thereof is in contact with the protruded electrode 113. The post 407 is made of the same material as the metal wiring layer 303, and the height (corresponding to the distance from the surface of the metal wiring layer 303 up to the surface of an sealing resin 115) thereof is about 100 μm.

The sealing film 111 is formed over the entire surface 109 of the semiconductor substrate 103 so as to cover the whole surface 109 of the semiconductor substrate 103 except for the top of the post 407. Namely, the sealing resin 111 covers the side faces of the interlayer dielectric 403, metal thin-film layer 405, metal wiring layer 303 and post 407. The surface of the sealing resin 111 and the top of the post 407 are flush with each other. The sealing resin 111 is made up of an opaque epoxy resin, for example.

The protruded electrode 113 is formed on the top of the post 407. The protruded electrode 113 is an electrode connected to its corresponding wiring of an unillustrated printed circuit board as will be described later. Thus, at least one circuit element formed on the semiconductor substrate 103 is electrically connected to an external device through the electrode pad 301, metal thin-film layer 405, metal wiring layer 303, post 407 and protruded electrode 113. Thus, the protruded electrode 113 functions as an external terminal of the semiconductor device 101. The protruded electrode 113 is made of solder, for example. Further, the protruded electrode 113 is shaped in the form of a semi-circular sphere whose diameter is 400 μm.

A method of mounting or packaging a semiconductor device 101 on a mounting board or printed circuit board 501 will next be described below with reference to FIGS. 5 and 6.

Figure 5:
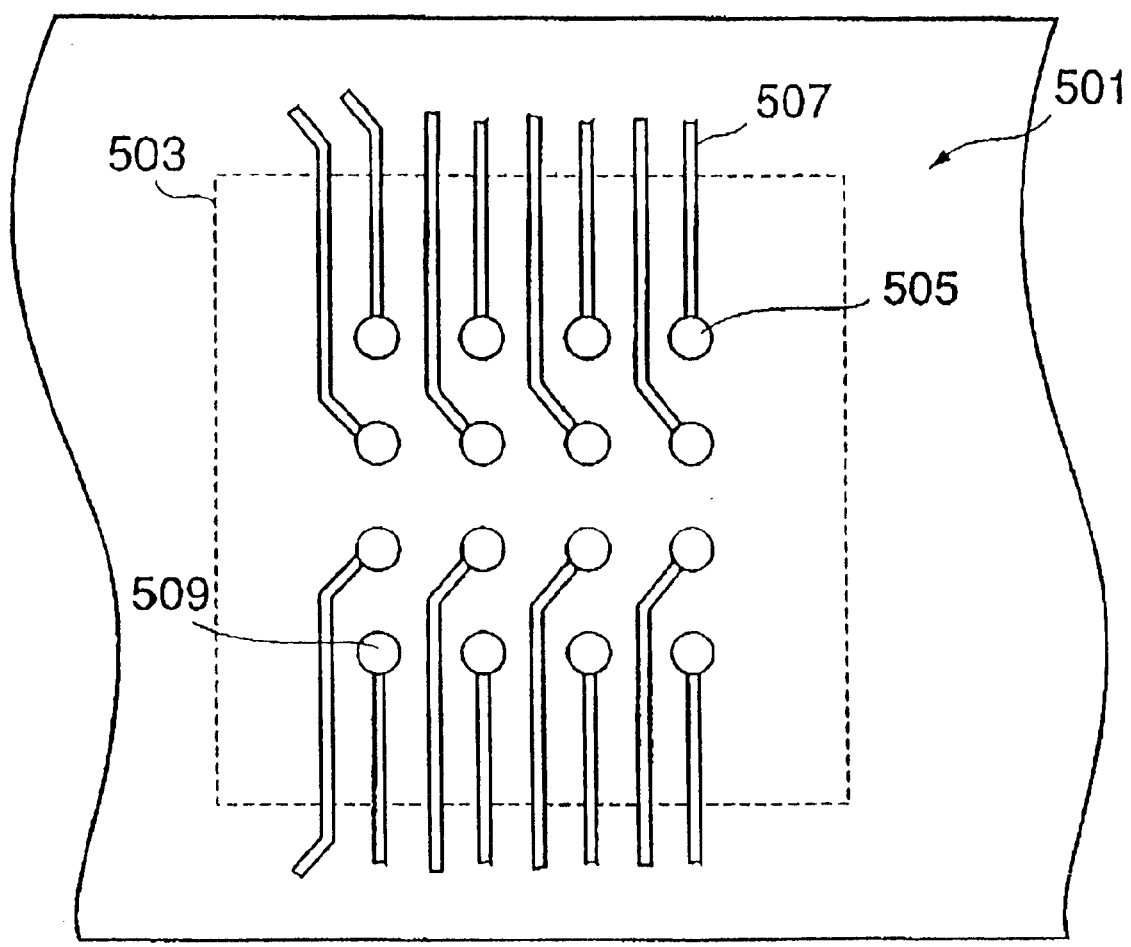
FIG. 5 is a plan view showing a printed circuit board 501.

FIG. 5 is a plan view showing the printed circuit board 501.

A plurality of terminals 505 corresponding to a plurality of protruded electrodes 113 of the semiconductor device 101 are formed on the surface of the printed circuit board 501 in matrix form. The terminal 509 corresponding to each specific terminal, of the plurality of terminals 505 is placed in the lower left as viewed in the drawing. The terminal 509 is a terminal corresponding to an address signal A1, for example, and is a terminal called a "first terminal".

Corresponding wirings 507 are connected to the respective terminals 505. These wirings 507 are connected to an unillustrated other device mounted on the printed circuit board 501, for example.

A mounting area 503 is indicated by a dotted line. The mounting area 503 is an area on which the semiconductor device 101 is to be mounted. The dotted line indicates an outer shape of the semiconductor device 101.

FIG. 6 is a process diagram showing a process for mounting a semiconductor device 101 over a printed circuit board 501. This process will be described with reference to FIG. 6.

Specific protruded electrodes 114 of a plurality of protruded electrodes 113 of the semiconductor device 101 are external terminals each corresponding to an address signal A1, for example, which each terminal will be called a "first pin". The semiconductor device 101 like a WCSP is fractionized or separated from a semiconductor wafer and thereafter temporarily accommodated in a tape 1 and reel or a tray. However, it is necessary to accommodate the fractionized semiconductor devices 101 in the tape and reel with the directions thereof placed in alignment in consideration of a subsequent mounting process. Namely, it is necessary to accommodate the semiconductor device 101 within the tape and reel so that the positions of the first pins of the semiconductor device 101 are all placed in the lower left, for example, within the tape and reel.

Each of the semiconductor devices 101 is accommodated in the tape and reel by use of an auto handler provided with an image recognizer. Unillustrated first pin marks are formed on a reverse side or back 105 located in the neighborhood of the first pins. Thus, the auto handler recognizes the positions of the first pins. Consequently, the auto handler accommodates the semiconductor device 101 within the tape and reel so that the positions of the first pins of the semiconductor device 101 are all placed in the lower left.

Figure 6A:
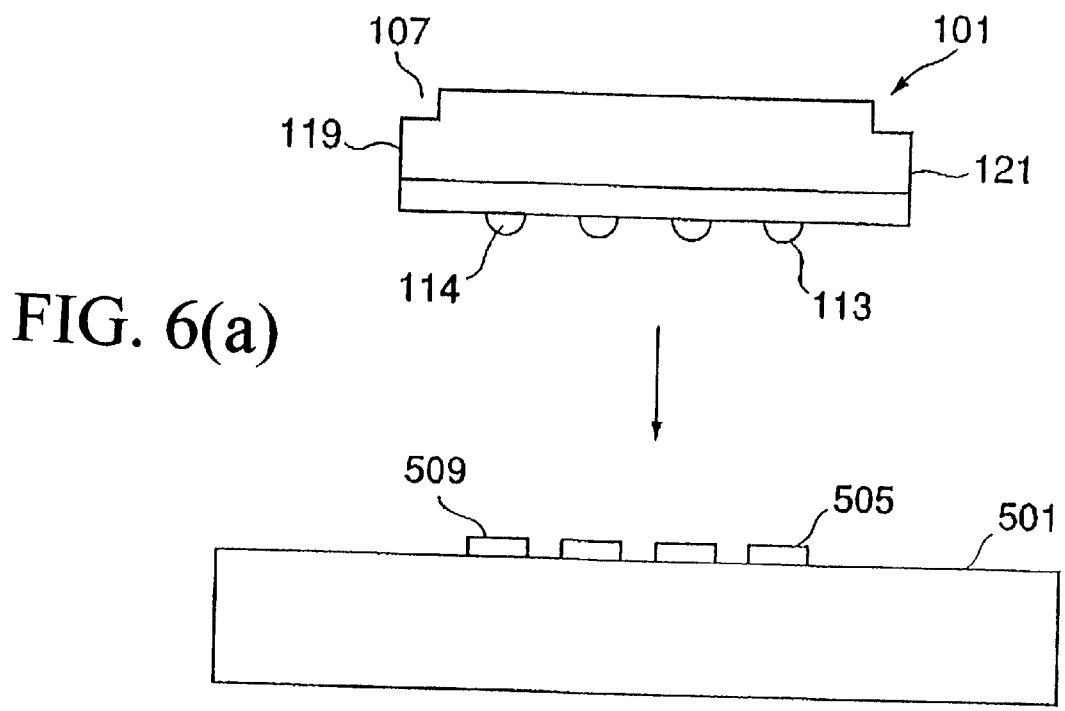
FIG. 6(a) and FIG. 6(b) are process diagrams illustrating process for mounting the semiconductor device 101 over the printed circuit board 501.

The semiconductor device 101 held in the tape and reel as described above is taken out from the tape and reel by an automatic mounting or packaging device provided with an image recognizer. Since the present automatic mounting device is also provided with the image recognizer as a matter of course, the direction of the semiconductor device 101 is recognized by the automatic mounting device. As shown in FIG. 6(a), the taken-out semiconductor device 101 is placed above the printed circuit board 501 by the automatic mounting device. At this time, the semiconductor device 101 is located face to face with the printed circuit board 501 so that the first pins 114 and the first terminals 509 correspond to each other.

Figure 6B:
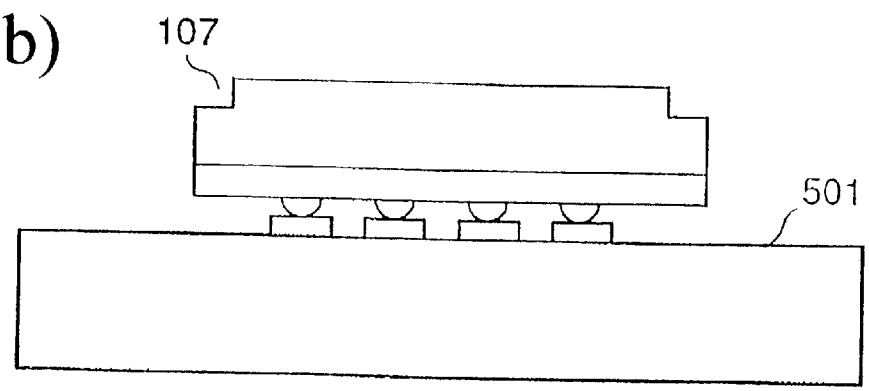

Next, as shown in FIG. 6(b), the protruded electrodes 113 of the semiconductor device 101 are connected to their corresponding plural terminals 505 of the printed circuit board 501. The mounting process is completed in this way.

Subsequently, a visual inspecting process for inspecting whether the semiconductor device 101 is placed in a predetermined position on the printed circuit board 501 and mounted aslant to the surface of the printed circuit board 501, is executed. The visual inspecting process is carried out by a visual inspecting device using a laser beam.

First of all, a laser light source attached to the visual inspecting device applies a laser beam to the printed circuit board 501 and the semiconductor device 101 to be inspected. The laser beam is reflected by the printed circuit board 501 and the semiconductor device 101 and a light detecting or receiving device mounted to the visual inspecting device receives the reflected laser beam. The printed circuit board is shifted in either an X-axis direction or a Y-axis direction to thereby carry out a series of operations for the irradiation and reception of the laser beam. Namely, the laser beam scans over the semiconductor device 101 and the printed circuit board 501. The visual inspecting device measures the difference between the intensity of the laser beam emitted from the laser light source and the intensity of the laser beam received by the light receiving device. Thus, the visual inspecting device recognizes the outer shape (contour) of the semiconductor device 101. The visual inspecting device executes the above-described position and height inspections, based on the result of its recognition.

In the present embodiment, a steplike section 107 is provided in a peripheral area of the back 105 of the semiconductor device 101. Thus, the intensity of the laser beam reflected by the steplike section 107 becomes smaller than the intensity of the laser beam reflected by the printed circuit board 501 and the intensity of the laser beam reflected by the back 105 held in a mirror state. This is because the laser beam is irregularly reflected due to a step of the steplike section 107. Further, the steplike section 107 is formed with a dicing blade as will be described later. Thus, the state of the surface (the peripheral area of the back 105 of the semiconductor substrate 103) of the steplike section 107 is rougher or coarser than a central area (back held in the mirror state) of the back 105 of the semiconductor substrate 103. Therefore, the intensity of the laser beam reflected by the surface held in this coarse state and returned to the light receiving device is smaller than that of the laser beam reflected by the back held in the mirror state and returned to the light receiving device. This is also because the laser beam is irregularly reflected by the surface held in the coarse state.

The differences among the intensity of the laser beam reflected by the steplike section 107, the intensity of the laser beam reflected by the printed circuit board 501, and the intensity of the laser beam reflected by the back 105 held in the mirror state are emphasized. Thus, the visual inspecting device is capable of reliably recognizing the outer shape (contour) of the semiconductor device 101. As a result, the visual inspecting device is capable of accurately carrying out position and height inspections.

According to the present embodiment as described above, even if the back of the semiconductor substrate 103 is kept in the mirror state, the steplike section 107 attached to the semiconductor substrate 103 makes it possible to easily detect the state of mounting or packaging of the semiconductor device 101. Thus, the mismounting of the semiconductor device 101 can be determined accurately and at high speed in the visual inspecting process.

Figure 12:
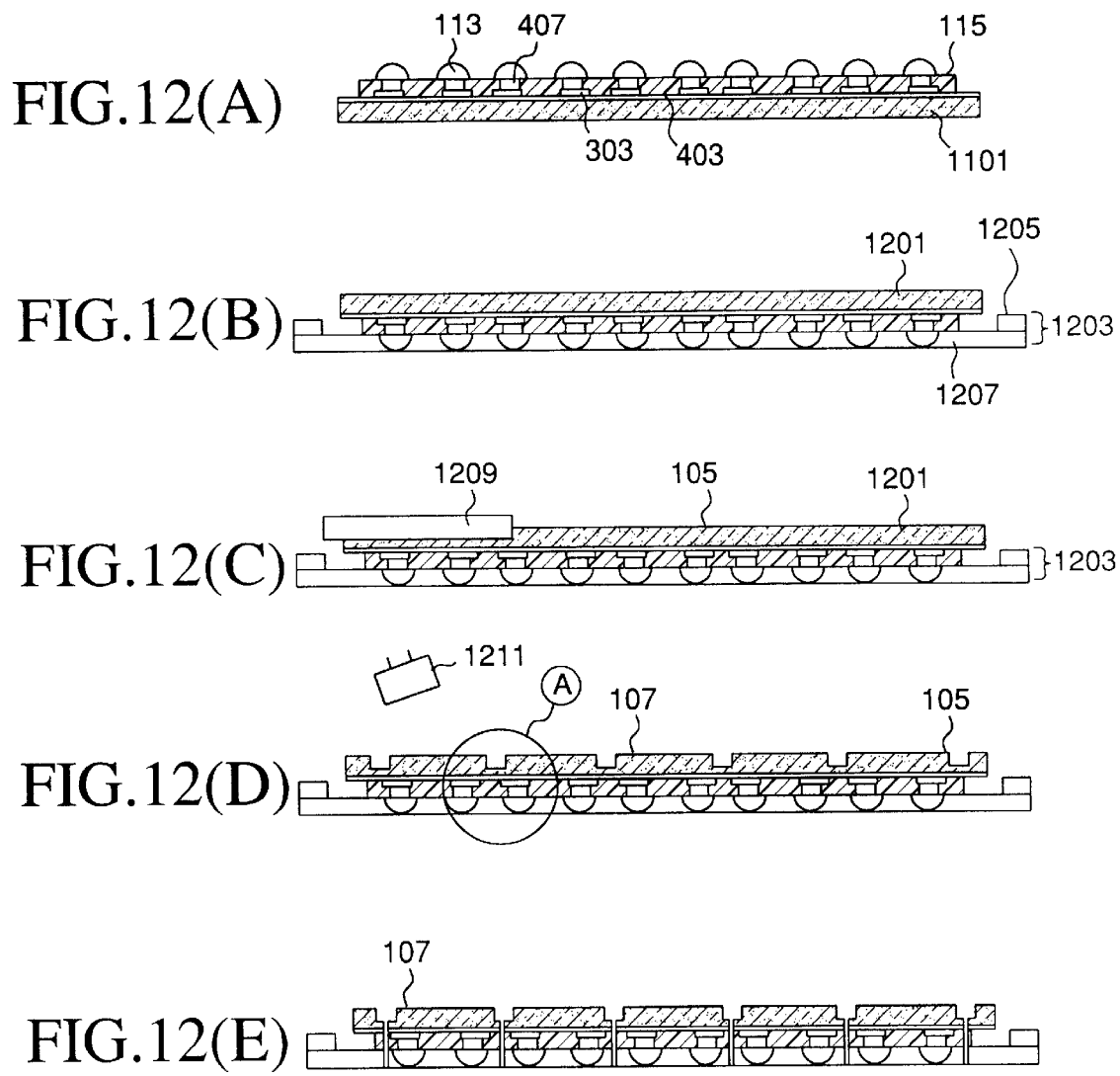
FIG. 12(A) through FIG. 12(E) are process diagrams illustrating a second process used for the semiconductor device 101 according to the first embodiment of the present invention.
Figure 13:
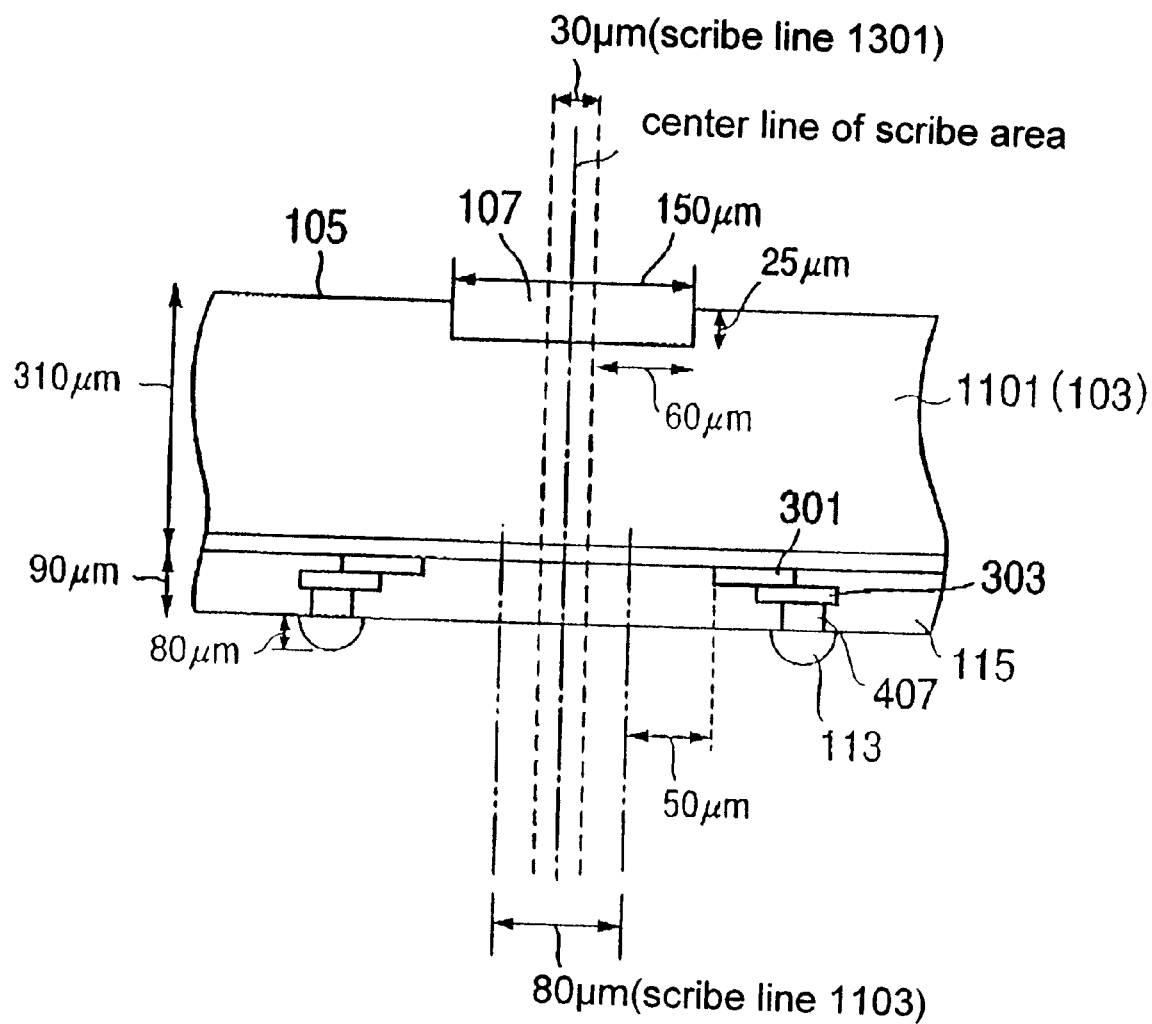
FIG. 13 is a diagram showing a schematic cross-section of a portion indicated by a round mark "A" in a process step of FIG. 12(D).
Figure 14:
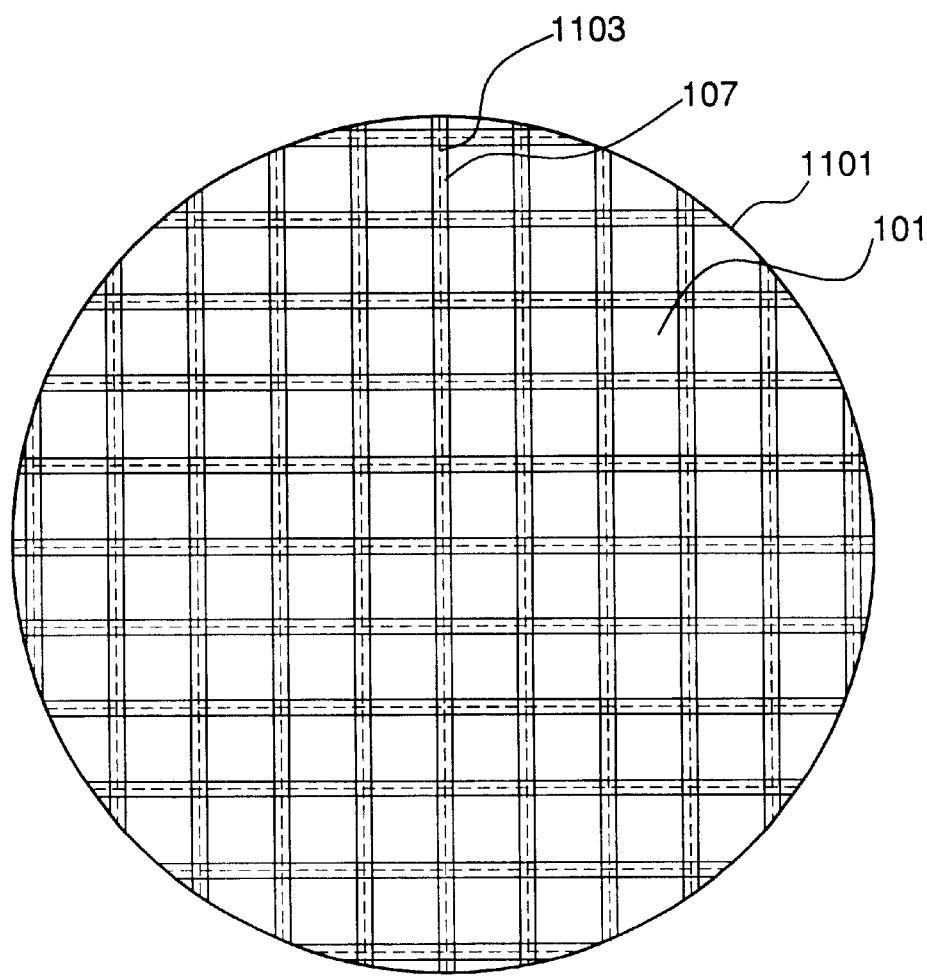
FIG. 14 is a diagram showing the reverse side of a semiconductor wafer 1101 in the process step of FIG. 12(D).

A method of manufacturing the semiconductor device 101 according to the first embodiment of the present invention will next be described below. In order to make its description easy, a process (corresponding to a process prior to the dicing of the semiconductor wafer) up to the formation of the protruded electrodes 113 is called a "first process", and a process subsequent to the first process is called a "second process". They will be described below respectively. The first process is shown in FIGS. 7 through 10, and the second process is shown in FIGS. 12 through 14.

To begin with, the first process according to the first embodiment will be explained below.

Incidentally, only a portion corresponding to line 4—4 of FIG. 3 will be explained in the first process for the purpose of making its description easy.

Unillustrated plural circuit elements are first formed on a surface 109 (first main surface) of a semiconductor substrate 103 held in a semiconductor wafer state. Next, an insulting layer 402 having contact holes (not shown) is formed over the respective circuit elements. An unillustrated conductive layer is formed inside each contact hole. Subsequently, an aluminum film containing silicon is deposited on the insulating layer 402 by a sputtering method. Afterwards, the aluminum film is etched into a predetermined shape, which in turn is left on the insulating layer 402 as an electrode pad 301 as shown in the drawing. The electrode pad 301 is connected to its corresponding unillustrated conductive layer formed inside the insulating layer 402 (see FIG. 7(A)).

Next, a passivation film 401 formed of a silicon nitride film is formed on the insulating layer 402 and the electrode pad 301 by a CVD method. Thereafter, the passivation film 401 placed on a central area of the electrode pad 301 is removed by etching (see FIG. 7(B)).

Figure 7A:
FIG. 7(A) through FIG. 7(G) are process diagrams depicting a method of manufacturing the semiconductor device 101 according to the first embodiment of the present invention.
Figure 7B:
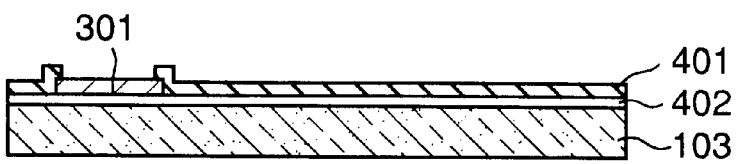
Figure 7C:
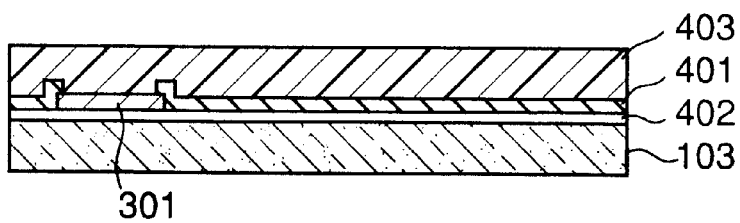

Next, an interlayer dielectric or insulator 403 formed of polyimide is formed on the passivation film 401 and the electrode pad 301 (see FIG. 7(C)).

Figure 7D:
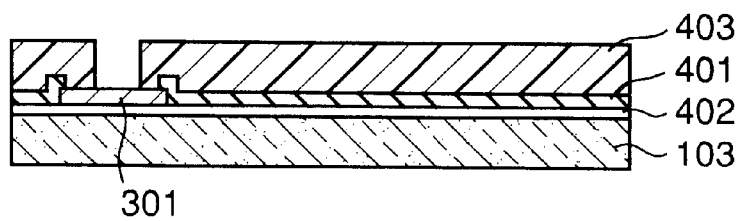
Figure 7E:
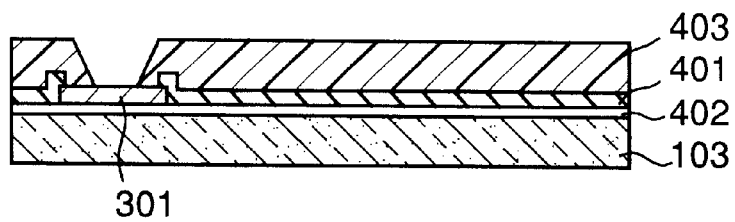
Figure 7F:
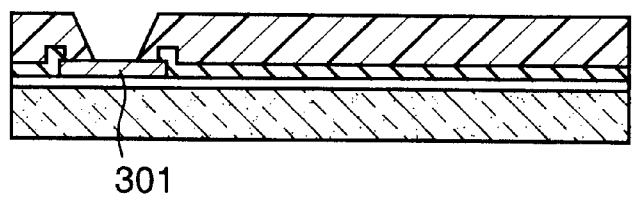

Next, the interlayer insulator 403 placed in the central area of the electrode pad 301 is removed by etching (see FIG. 7(D)).

Heat treatment is next made to thermoset the interlayer insulator 403 formed of polyimide. Owing to such thermosetting, the interlayer insulator 403 located on the electrode pad 301 is shaped in tapered form as shown in the drawing. When polyimide exists on the surface of the electrode pad 301, it is removed by plasma etching in an oxygen atmosphere (see FIG. 7(E)).

Next, the interlayer insulator 403 is subjected to plasma etching in an atmosphere of an inert gas such as an argon gas or the like, so that the surface of the interlayer insulator 403 changes in quality. A surface layer thereof having changed in quality is indicated by a thick line. The existence of the surface layer yields an improvement in adhesion between the interlayer insulator 403 and a metal thin-film layer 405 formed in the following step (see FIG. 7(F)).

Figure 7G:
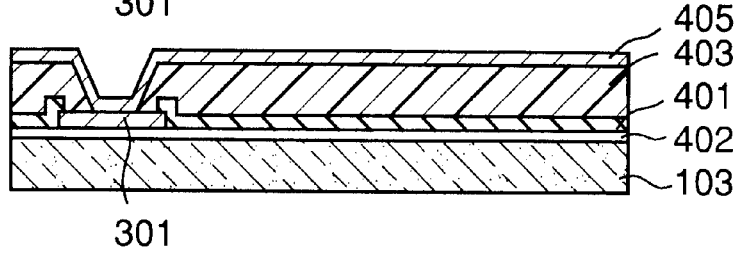

Next, the metal thin-film layer 405 is formed on the interlayer insulator 403 and the electrode pad 301 by the sputtering method (see FIG. 7(G)).

A resist 801 is next formed on the metal thin-film layer 405. The thickness of the resist is about 10 µm, for example. Subsequently, the resist 801 located in an illustrated predetermined area is removed by etching (see FIG. 8(A)).

Next, a metal wiring layer 303 is selectively formed on the metal thin-film layer 405 exposed by electrolytic plating. Incidentally, the thickness of the metal wiring layer 303 is thinner than that of the resist 801 and is 5 µm, for example (see FIG. 8(B)).

Figure 8A:
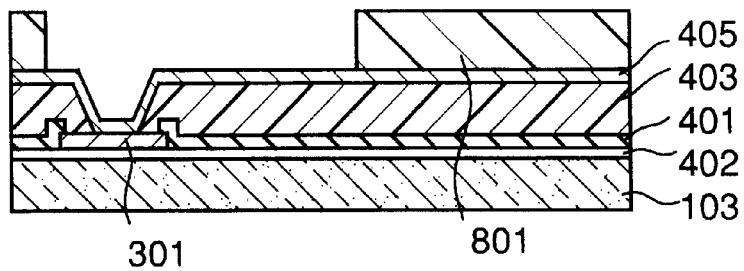
FIG. 8(A) through FIG. 8(E) are process diagrams showing the method of manufacturing the semiconductor device according to the first embodiment of the present invention.
Figure 8B:
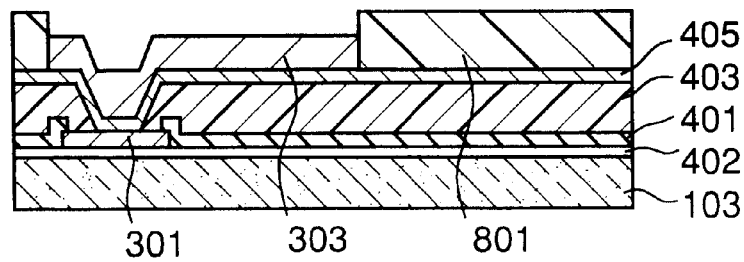
Figure 8C:
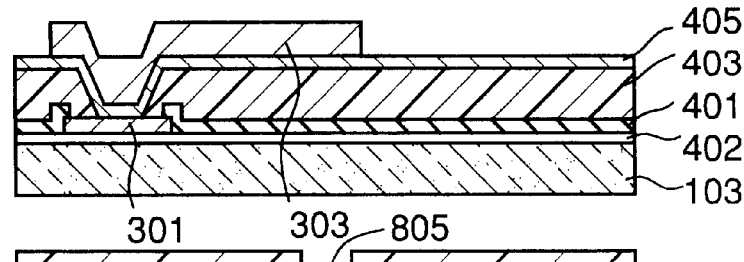
Figure 8D:
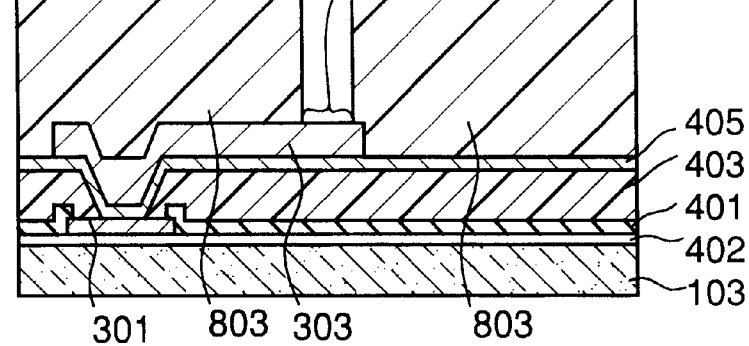
Figure 8E:
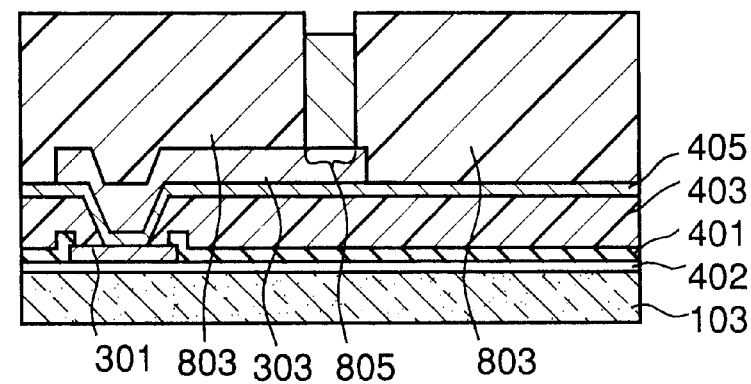

Next, the resist 801 is removed by using a remover such as acetone or the like (see FIG. 8(C)).

Next, a resist 803 having a thickness of about 120 µm is formed on the metal thin-film layer 405 and the metal wiring layer 303. Subsequently, the resist 803 placed on a post forming area 805 is removed.

A post 407 is next formed on the post forming area 805 by the electrolytic plating. Incidentally, the thickness of the post 407 is thinner than that of the resist 803 and is about 100 µm. Further, the post 407 is formed of the same material as the metal wiring layer 303. Thus, the plating solution used in FIG. 8(B) can be used (see FIG. 8(D)).

Figure 9A:
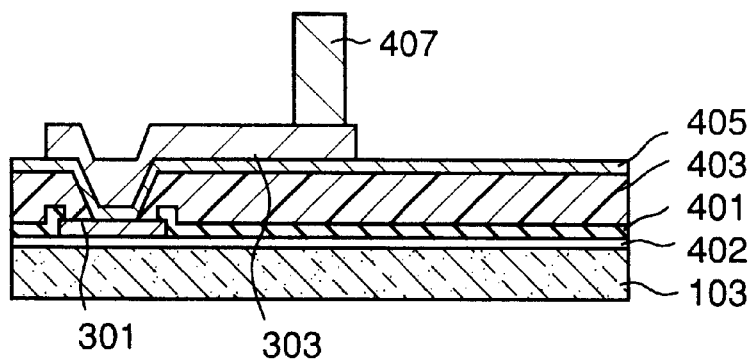
FIG. 9(A) through FIG. 9(D) are process diagrams illustrating the method of manufacturing the semiconductor device 101 according to the first embodiment of the present invention.

Next, the resist 805 is removed by a remover (see FIG. 9(A)).

Figure 9B:
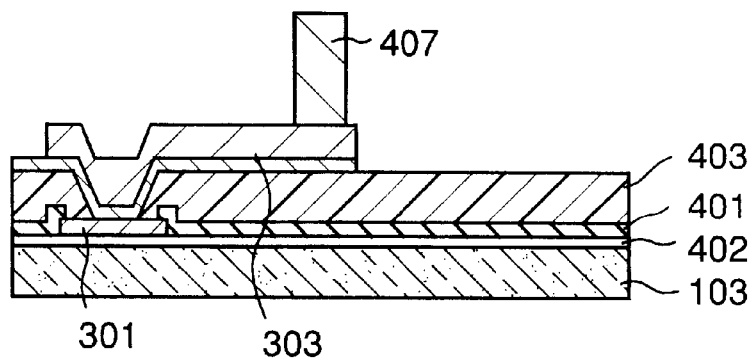
Figure 9C:
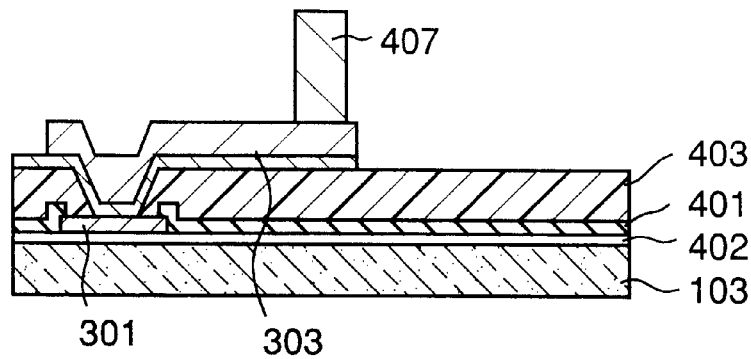
Figure 9D:
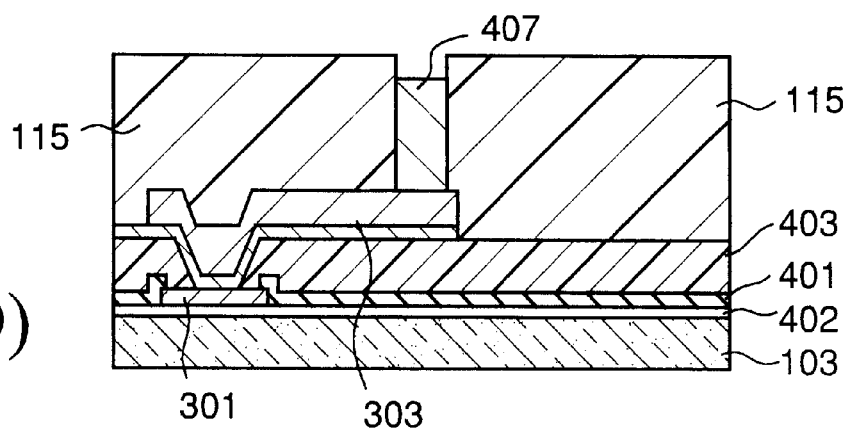
Figure 10:
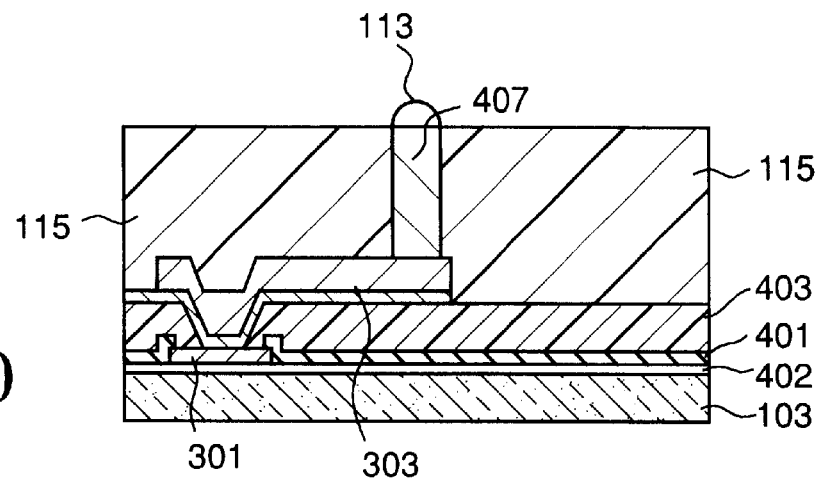
FIG. 10 is a process diagram depicting a first process used for the semiconductor device 101 according to the first embodiment of the present invention.

Next, the exposed metal thin-film layer 405 is removed by being exposed to plasma etching in an atmosphere of an oxygen gas (FIG. 9(B)).

Next, the surface layer of the exposed interlayer insulator 403 is removed by wet etching. Thus, a current, which flows in the metal wiring layer 303, can be prevented from leaking into another metal wiring layer 303 through the surface layer (see FIG. 9(C)).

Next, the whole semiconductor wafer is inserted into an unillustrated sealing mold. With the injection of an sealing resin inside the sealing mold, an sealing resin 115 is subsequently formed on the surface 109 side of the semiconductor substrate 103. As shown in the drawing, the sealing resin 115 covers the side faces of the interlayer insulator 403, the metal thin-film layer 405, the metal wiring layer 303 and the post 407 (see FIG. 9(D)).

Next, the surface of the sealing resin 115 is polished to expose an upper surface of the protruded electrode 113. The surface of the sealing resin 115 and the upper surface of the protruded electrode 113 are located within the same plane.

Next, the protruded electrode 113 is formed on its corresponding upper surface of the post 407 by a screen printing method. The protruded electrode 113 is made up of solder and is a hemisphere having a diameter of about 400 µm (see FIG. 10).

Figure 11:
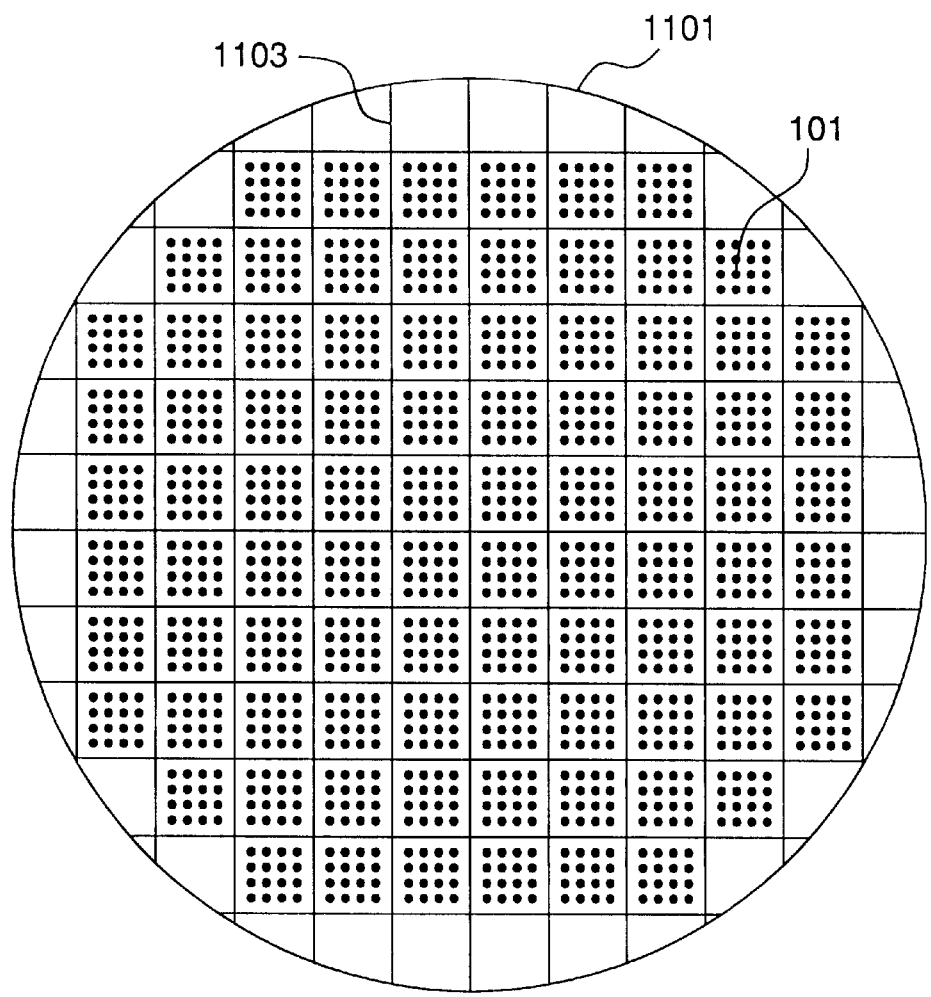
FIG. 11 is a plan view showing the surface side of a semiconductor wafer 1101.

The surface side of a semiconductor wafer 1101 subjected to the above-described process is shown in FIG. 11. FIG. 11 shows that a plurality of semiconductor devices 101, which will later be fractionized or separated in the second process to be described later, are disposed in a semiconductor wafer state. These semiconductor devices 101 are spaced away from one another by a plurality of scribe areas 1103. Incidentally, since steplike sections 107 are not yet provided at the backs of the respective semiconductor devices 101, the illustration of the back side of the semiconductor wafer will be omitted.

The second process following the first process referred to above will next be explained below using FIG. 12

FIG. 12 is a process diagram showing the second process for the semiconductor device 101 according to the present embodiment. Incidentally, the illustration of part of a structure thereof is omitted in order to facilitate its description.

Firstly, the state of the semiconductor device 101 subjected to the process of from FIG. 7 to FIG. 10 is shown in FIG. 12(A).

A semiconductor wafer 1101, an interlayer dielectric or insulator 403, a metal wiring layer 303, posts 407 and protruded electrodes 113 are shown in FIG. 12(A).

A wafer holder 1203 having a wafer ring 1205 and a dicing sheet 1207 is next prepared. The wafer ring 1205 has a ring shape. The dicing sheet 1207 makes use of a UV tape having such a characteristic that it is reduced in adhesive power by being irradiated with ultraviolet light, for example.

The semiconductor wafer 1101 is attached over the dicing sheet 1207 so that the protruded electrodes 113 make contact with the dicing sheet 1207 (see FIG. 12(B)).

Next, the wafer holder 1203 is placed on an unillustrated grinder having two diamond grinding stones 1209. The first diamond grinding stone 1209 has a roughness of #325, and the second diamond grinding stone 1209 has a roughness of #2000. The back of the semiconductor wafer 1101 placed on the grinder is ground as follows: To begin with, the back thereof is roughly polished by the first diamond grinding stone, and subsequently finely ground by the second diamond grinding stone. Owing to these grinding processes, a semiconductor wafer 1101 having a thickness of about 310 µm is finally obtained.

Further, owing to the grinding done by the second diamond grinding stone, the back of the semiconductor wafer is brought into the aforementioned mirror state. If such fine back grinding is not done, then the mirror state might not be produced. However, the detection of each scribe area by an infrared camera in a process step of FIG. 12(D) needs the fine grinding by the second diamond grinding stone. This is because if the state of the back of the semiconductor substrate 103 is rough, then infrared light is not easily transmitted therethrough (see FIG. 12(C)).

Next, the semiconductor wafer 1101 is placed on a dual dicing device with an unillustrated infrared camera 1211 in a state of being placed on the wafer ring 1205. The dual dicing device has two blades provided side by side. In the present embodiment, a first blade whose sectional shape is rectangular and whose thickness is 30 µm, and a second blade whose sectional shape is rectangular and whose thickness is 150 µm, are used as the two blades.

FIG. 13 shows a schematic cross-section of a portion supplied with a round mark "A" in FIG. 12(D). The width of each scribe area 1103 is defined as about 80 µm. The distance between the edge of the scribe area 1103 and the edge of each electrode pad 301 is defined as about 50 µm. The width of each scribe line 1301 to be cut later is about 30 µm substantially identical to that of the first blade. Steplike sections 107 formed in the process step of FIG. 12(D) are formed in an about 150 µm-range including the center line of each scribe area. The width of the steplike sections 107 is about 150 µm, identical to the width of the second blade, and the depth thereof is about 25 µm.

As shown in FIG. 12(D), pattern shapes of a plurality of electrode pads 301 or metal wiring layers 303 formed on the surface 109 side of the semiconductor wafer are first recognized from the back of the semiconductor wafer 1101 by the infrared camera 1211. Consequently, the scribe areas 1103, which exist on the surface 109 of the semiconductor wafer 1101, are recognized by the dicing device.

The second blade is placed on the center line of each scribe area 1103. Thereafter, the back 105 of the semiconductor wafer 1101 is ground (half-cut) about 25 μm by the second blade so that each steplike section 107 is formed (see FIG. 13). The surface of the steplike section 107 is coarser than the other back surface 105 of the semiconductor wafer 1101 (semiconductor substrate 103), in which has been brought to the mirror state due to the grinding done by the second grinding stone 1209. The grinding by the second blade is effected on all the scribe areas 1103 of the semiconductor wafer 1101. Namely, the grinding by second blade is executed in association with the four sides of all the semiconductor devices 101 (see FIG. 12(D)).

FIG. 14 is a diagram showing the back side of the semiconductor wafer 1101 in the process step of FIG. 12(D). It can be understood that the steplike sections 107 formed by the second blade are formed with respect to the four sides of the respective semiconductor devices 101.

Next, the first blade is placed on the center line of each scribe area 1103, i.e., the scribe line 1301. Thereafter, the back 105 of the semiconductor wafer 1101 is ground (fully cut) about 400 μm along each scribe line 1301 by the first blade. The grinding by the first blade is executed in association with the respective semiconductor devices 101 of the semiconductor wafer 1101. As a result, the respective semiconductor devices 101 are brought into separation or fractionalization (see FIG. 12(E)).

Next, the semiconductor wafer 1101 is shifted to an expand ring together with the dicing sheet 1207. Thereafter, the dicing sheet 1207 is subjected to ultraviolet rays, so that its adhesive power is lowered. The dicing sheet 1207 is extended in the outer peripheral direction of the semiconductor wafer 1101 and the respective semiconductor devices 101 are taken out by a collet.

The semiconductor device 101 shown in FIGS. 1 and 2 is finally obtained through the above-described second process.

While the effect of the semiconductor device according to the present invention has already been described above, the present invention has a peculiar effect even with respect to a manufacturing method thereof. Namely, since the steplike section 107 formed in the peripheral area of the back of each semiconductor device can be formed by the blades used in the dicing process, a specific process for providing the steplike section 107 is substantially unnecessary. It is thus possible to obtain the semiconductor device without substantially providing the specific process.

Figure 15:
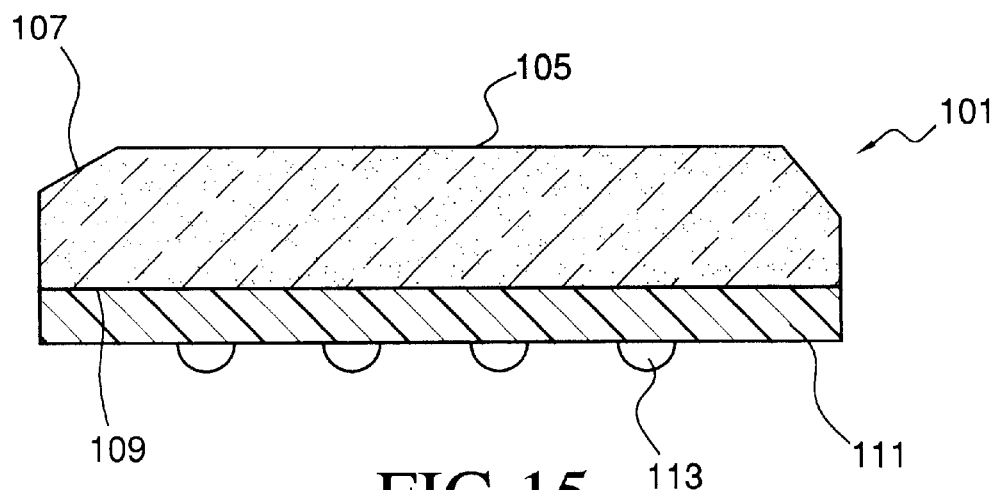
FIG. 15 is a diagram illustrating a modification of the semiconductor device according to the first embodiment of the present invention.
Figure 16:
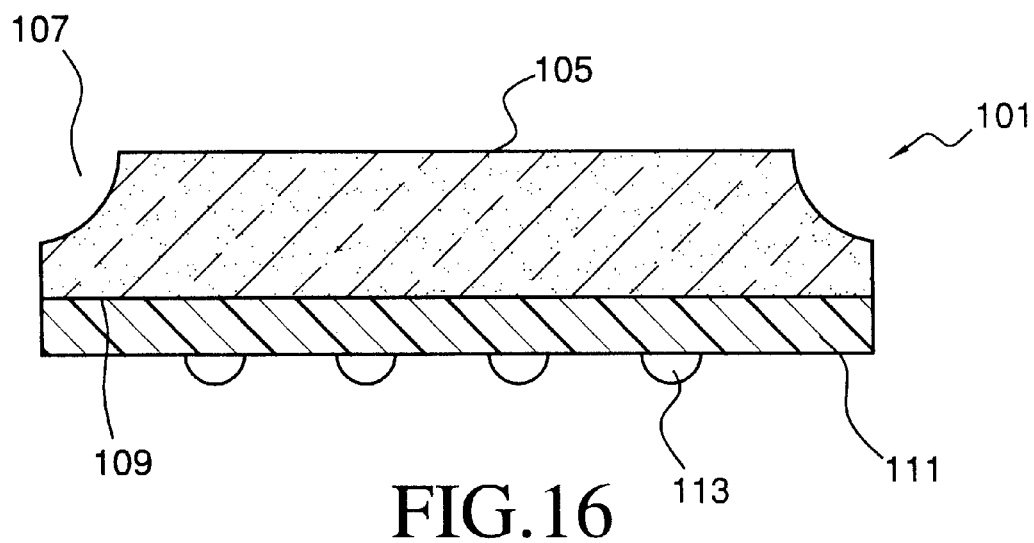
FIG. 16 is a diagram depicting another modification of the semiconductor device according to the first embodiment of the present invention.

Incidentally, the steplike section 107 according to the present invention may take such shapes, i.e., inclined shapes as shown in FIGS. 15 and 16 as well as such a shape as shown in FIG. 2. In this case, the steplike section 107 might as well be called an "inclined or slope portion or section 107". However, such inclined shapes as shown in FIGS. 15 and 16 will be described as steplike shapes (steplike sections) in the specification of the present application.

Incidentally, a second dicing blade whose section is V-shaped, is used to form such a shape as shown in FIG. 15. In order to form such a shape as shown in FIG. 16, a second dicing blade whose section is U-shaped, is used. In short, the steplike section or inclined section 107 may simply be formed along the respective sides of the semiconductor substrate 103. The steplike section or inclined section 107 may have such roughness as being distinguishable from a back 105 of a flat semiconductor substrate held in a mirror state.

Incidentally, when a second blade whose section is rectangular and whose thickness is 1200 μm, is used in the present embodiment, it was confirmed that the effect of the invention of the present application could further be emphasized. In this case, the width of the steplike section 107 of the semiconductor device 101 is about 500 μm.

Second Preferred Embodiment

A second embodiment showing a semiconductor device of the present invention will next be described below with reference to the accompanying drawings.

Figure 17:
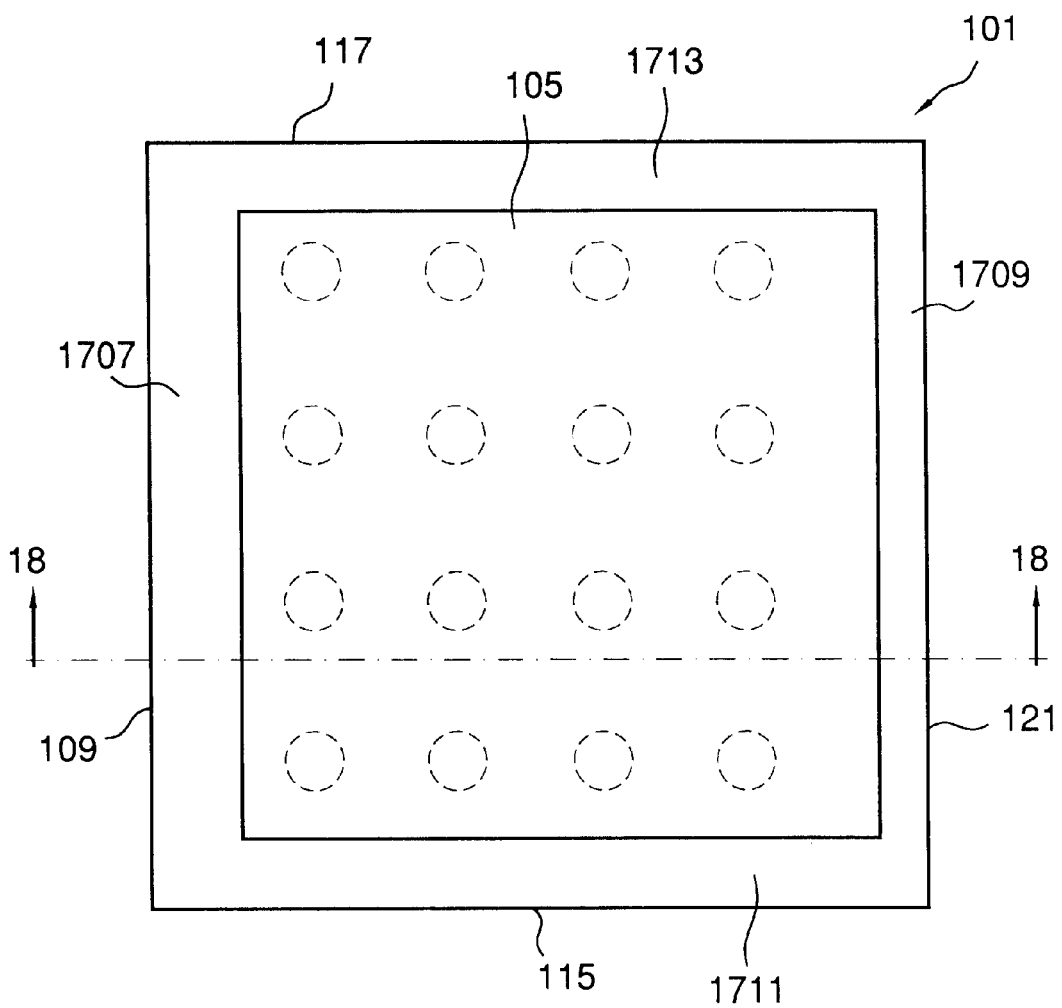
FIG. 17 is a plan perspective view showing the back of a semiconductor device according to a second embodiment of the present invention.
Figure 18:
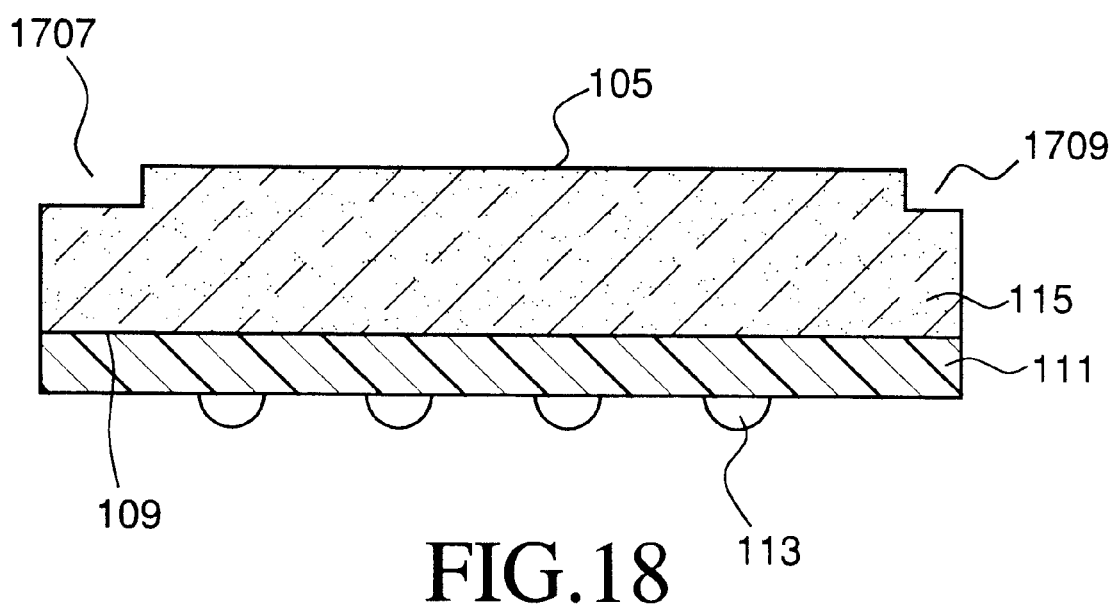
FIG. 18 is a schematic cross-sectional view taken along line 18—18 of FIG. 17.

FIG. 17 is a plan perspective view showing the second embodiment of the semiconductor device 101 of the present invention, and FIG. 18 is a schematic cross-sectional view taken along line 18—18 of FIG. 17, respectively.

The second embodiment is different from the first embodiment in terms of both the shape of the steplike section 107 and its manufacturing method. Since the second embodiment is substantially identical to the first embodiment in other configurations, the detailed description thereof will be omitted.

As shown in FIGS. 17 and 18, a semiconductor substrate 103 has a steplike section 107 (also called a "concave portion or trench portion") formed in a reverse side or back 105. The steplike section 107 is a characteristic portion of the present invention. The steplike section 107 comprises a steplike portion 1707 formed along a third side face 109 of the semiconductor substrate 103, a steplike portion 1709 formed along a fourth side face 121 of the semiconductor substrate 103, a steplike portion 1711 formed along a first side face 115 of the semiconductor substrate 103, and a steplike portion 1713 formed along a second side face 117 of the semiconductor substrate 103. The width of the steplike portion 1707 is about 85 μm, the width of the steplike portion 1709 is about 35 μm, and the widths of the steplike portion 1711 and the steplike portion 1713 are respectively about 60 μm.

Here, the term of "along the side faces" means that the respective steplike portions are formed in the back 105 with the side faces as starting points, or some of the side faces are chipped off to form the respective steplike portions in the back 105.

Figure 19A:
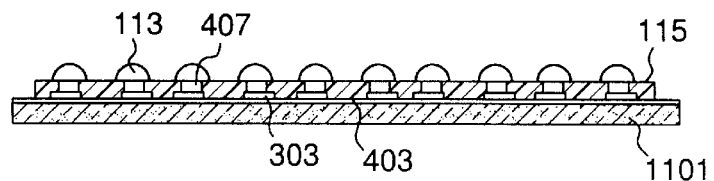
FIG. 19(A) through FIG. 19(E) are process diagrams showing a second process of the semiconductor device 101 according to the second embodiment of the present invention.
Figure 19B:
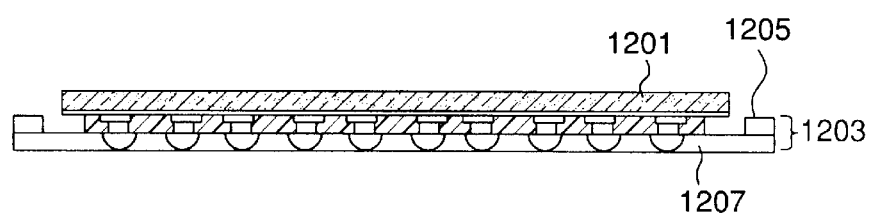
Figure 19C:
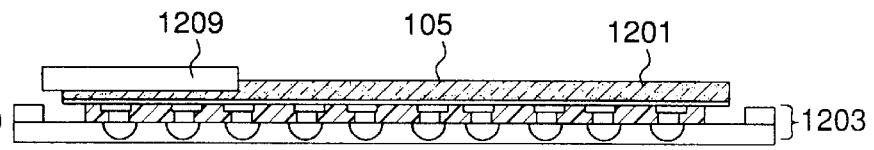

A second process employed in the present embodiment will next be explained below using FIG. 19. Incidentally, since a first process is identical to that employed in the first embodiment, the description thereof will be omitted. FIG. 19 is a process diagram showing the second process for the semiconductor device 101 according to the present embodiment. Since FIGS. 19(A) through 19(C) are identical to the first embodiment, the description thereof will be omitted.

Figure 19D:
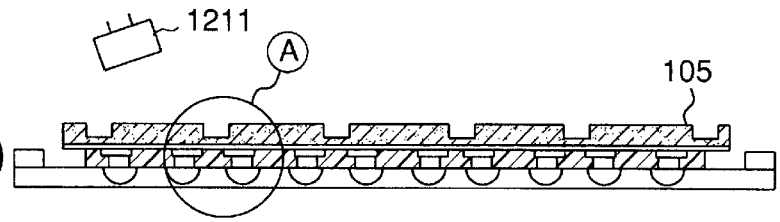
Figure 19E:
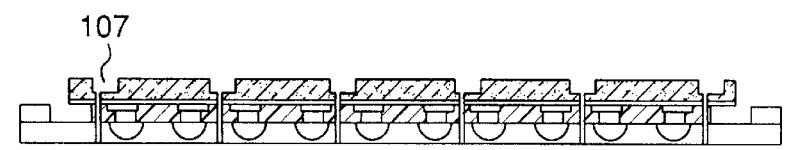

As shown in FIG. 19(D), a semiconductor wafer 1101 is placed on a dual dicing device with an unillustrated infrared camera 1211 in a state of being placed on a wafer ring 1203. The dual dicing device has two blades provided side by side. In the present embodiment, a first blade whose sectional shape is rectangular and whose thickness is 30 μm, and a second blade whose thickness is 150 μm, are used.

Figure 20:
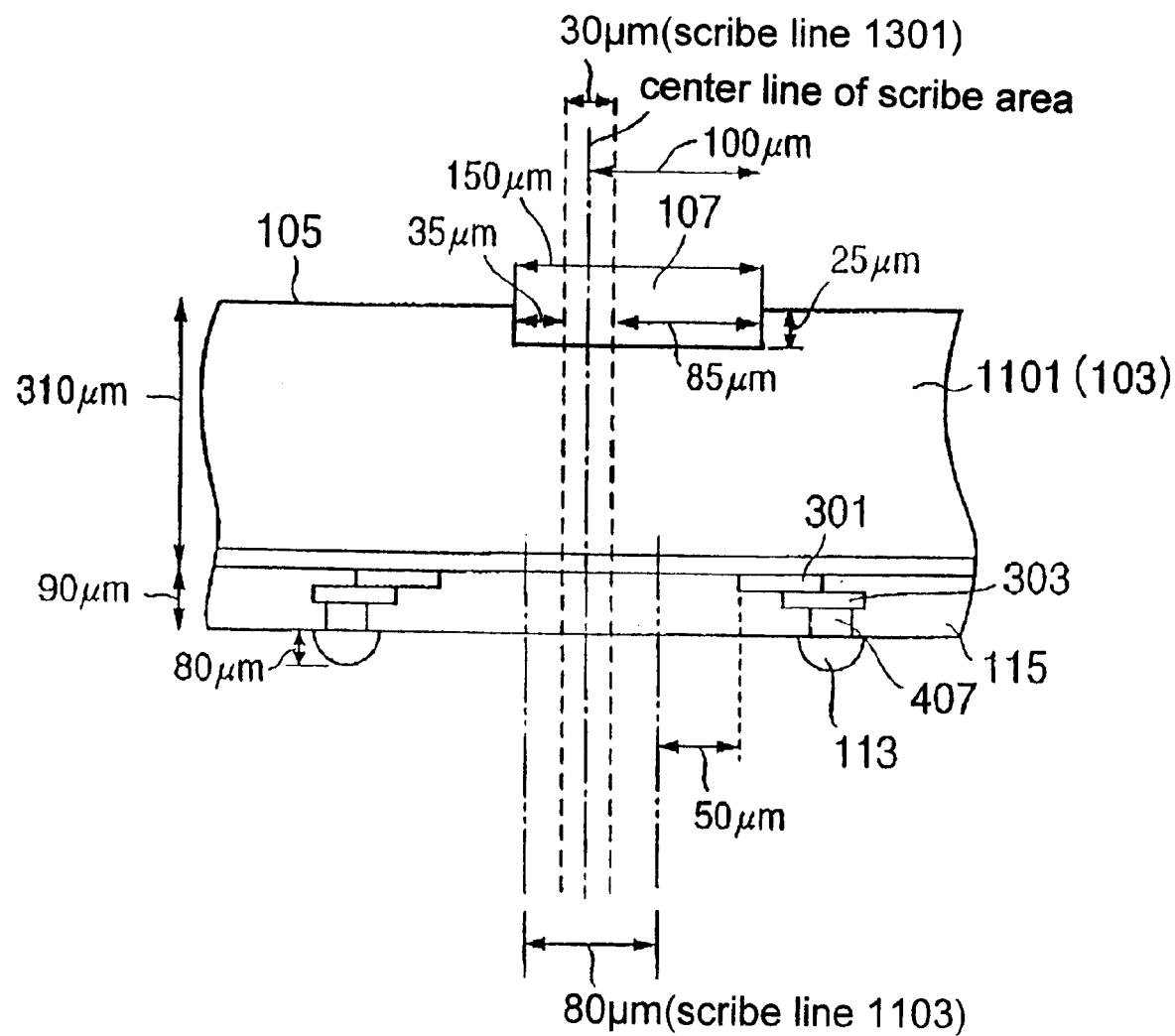
FIG. 20 is a diagram illustrating a schematic section of a portion indicated by a round mark "A" in a process step of FIG. 19(D).

FIG. 20 shows a schematic cross-section of a portion to which a round mark "A" in FIG. 19(D) is affixed. The width of each scribe area 1103 is defined as about 80 μm. The distance between the edge of the scribe area 1103 and the edge of each electrode pad 301 is defined as about 50 μm. The width of each scribe line 1301 to be cut later is about 30 μm substantially identical to that of the first blade. Steplike sections 1707 formed in the process step of FIG. 19(D) are formed in a range of about 150 μm corresponding to the sum of about 100 μm to the right side and about 50 μm to the left side as viewed from the center line of each scribe area. In this stage, the width of each steplike section 107 is about 150 μm identical to the width of the second blade, and the depth thereof is about 25 μm.

As shown in FIG. 19(D), pattern shapes of a plurality of electrode pads 301 or metal wiring layers 303 formed on the surface 109 side of the semiconductor wafer are first recognized from the back of the semiconductor wafer 1101 by means of the infrared camera 1211. Consequently, the scribe areas 1103, which exist on the surface 109 of the semiconductor wafer 1101, are recognized by the dicing device.

Figure 21:
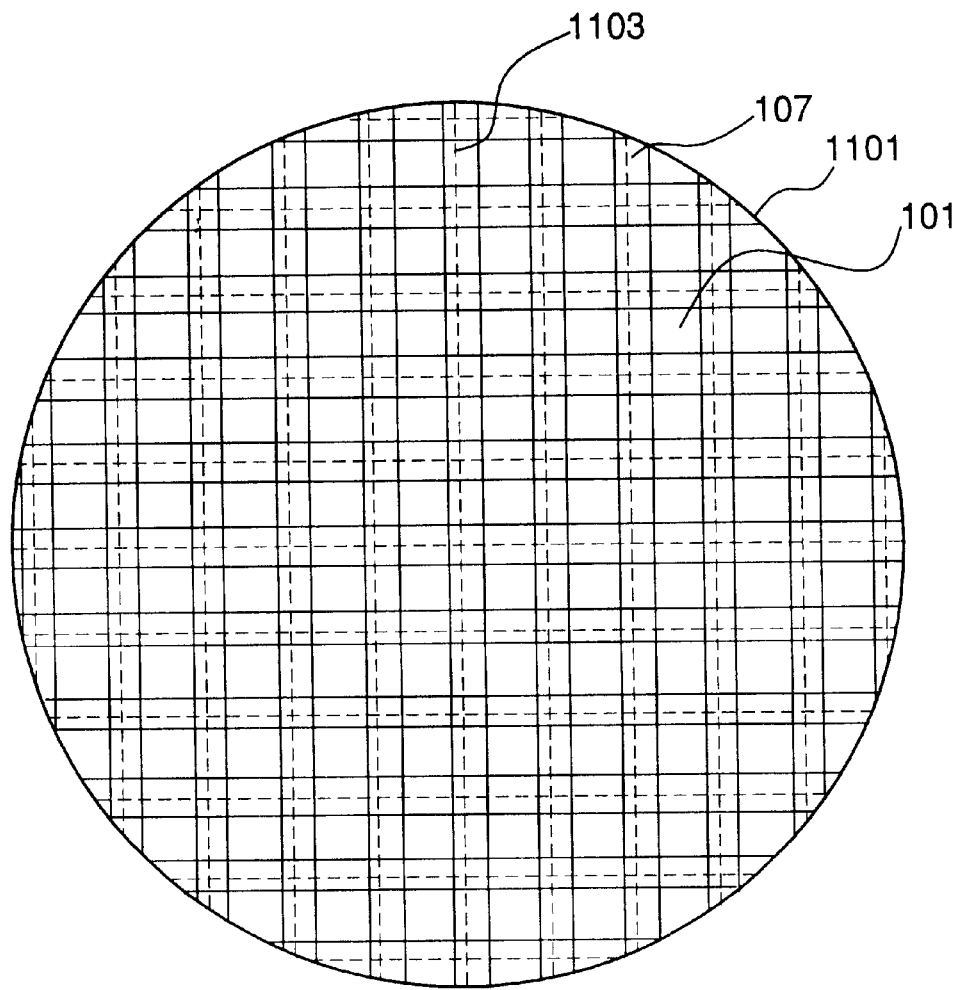
FIG. 21 is a diagram showing the reverse side of a semiconductor wafer 1101 in the process step of FIG. 19(D).

Next, the second blade is placed on the above-described range shown in FIG. 20 including the center line of each scribe area 1103 as viewed in a Y-axis direction (in the vertical direction of the sheet). Thereafter, the back 105 of the semiconductor wafer 1101 is ground (half-cut) about 25 μm by the second blade so that each individual steplike portions 1707 and 1709 are formed (see FIG. 20). Subsequently, the second blade is placed on the center line of the scribe area 1103 as viewed in an X-axis direction (in the horizontal direction of the sheet). Thereafter, the back 105 of the semiconductor wafer 1101 is ground (half-cut) about 25 μm by the second blade so that each individual steplike portions 1711 and 1713 are formed. The surfaces of their steplike sections 107 are also coarser than the other back 105 of the semiconductor wafer 1101 (semiconductor substrate 103), in which has been brought to the mirror state by the grinding done by the second grinding stone 1209 (see FIG. 19(D)). FIG. 21 is a diagram showing the back side of the semiconductor wafer 1101 in the process step of FIG. 19(D). It can be understood that the wide steplike portion 1707 formed by the second blade is formed along the left side of each semiconductor device 101, and the narrow steplike portion 1709 is formed along the right side of each semiconductor device 101. It can also be understood that the steplike portions 1711 and 1713 each having an intermediate width are respectively formed along the upper and lower sides of each semiconductor device 101.

Next, the first blade is placed on the center line of each scribe area 1103, i.e., the scribe line 1301. Thereafter, the back 105 of the semiconductor wafer 1101 is ground (fully cut) about 400 μm along each scribe line 1301 by the first blade. The grinding by the first blade is executed in association with the respective semiconductor devices 101 of the semiconductor wafer 1101. As a result, the respective semiconductor devices 101 are brought into fractionalization (see FIG. 19(E)).

Next, the semiconductor wafer 1101 is shifted to an expand ring together with a dicing sheet 1207. Thereafter, the dicing sheet 1207 is subjected to ultraviolet rays, so that its adhesive power is lowered. The dicing sheet 1207 is extended in the outer peripheral direction of the semiconductor wafer 1101 and the respective semiconductor devices 101 are taken out by a collet.

The semiconductor device 101 shown in FIGS. 17 and 18 is finally obtained through the above-described second process.

According to the semiconductor device showing the second embodiment of the present invention, it has the following peculiar effects in addition to the effects obtained by the semiconductor device according to the first embodiment. Namely, since the step section 107 formed in the back of the semiconductor substrate 103 is asymmetrical as viewed from the left and right, the wide steplike portion 1707 can be utilized as one pin mark, for example. Thus, the direction of each semiconductor device 101 can accurately be recognized in the process of accommodating each semiconductor device 101 in a tape and reel, the process of taking out it therefrom, and the process of mounting it to a printed circuit board. Incidentally, even if the recognizing work in the above processes is visually carried out by a human being, a similar effect can be obtained.

Figure 22:
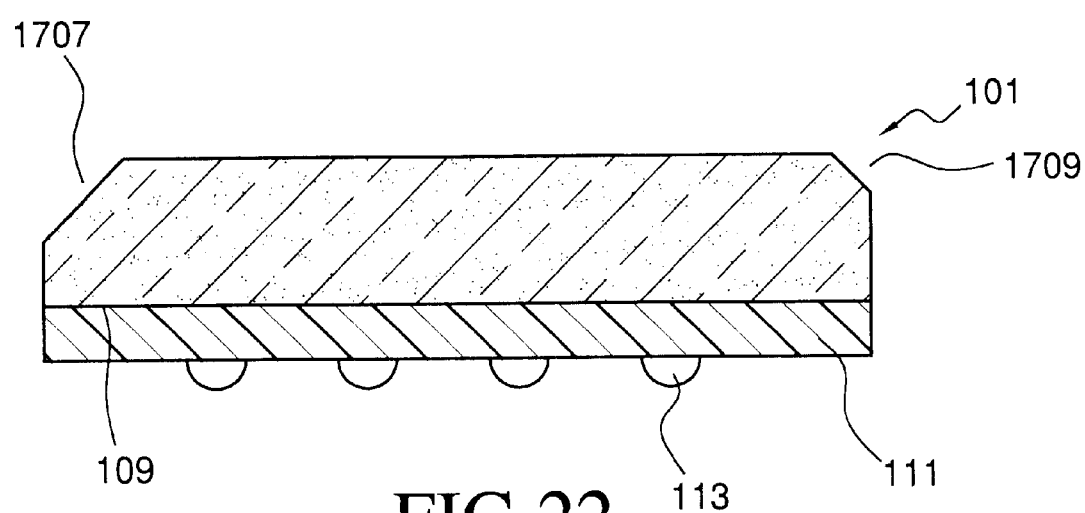
FIG. 22 is a diagram illustrating a modification of a semiconductor device according to the second embodiment of the present invention.
Figure 23:
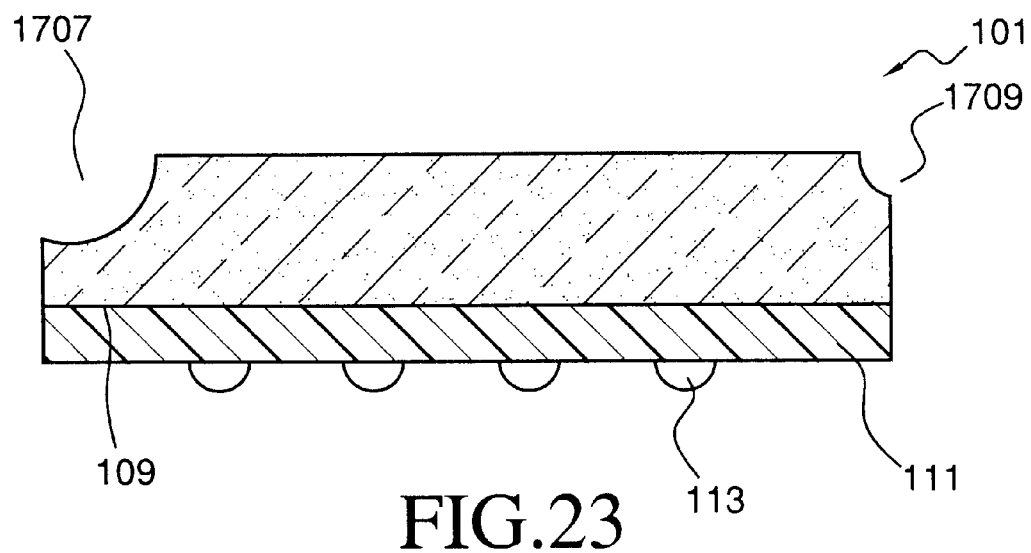
FIG. 23 is a diagram depicting another modification of the semiconductor device according to the second embodiment of the present invention.

Incidentally, the steplike section 107 according to the present invention may take shapes shown in FIGS. 22 and 23, for example, as well as such a shape as shown in FIGS. 17 and 18. In short, the shape of the steplike section 107 may be asymmetrical as viewed from the left and right.

Incidentally, a second dicing blade whose section is V-shaped, is used to form such a steplike section 107 as shown in FIG. 22. In order to form such a shape as shown in FIG. 23, a second dicing blade having a U-shaped cross-section is used.

Third Preferred Embodiment

A third embodiment of a semiconductor device according to the present invention will next be described below with reference to the accompanying drawings.

Figure 24:
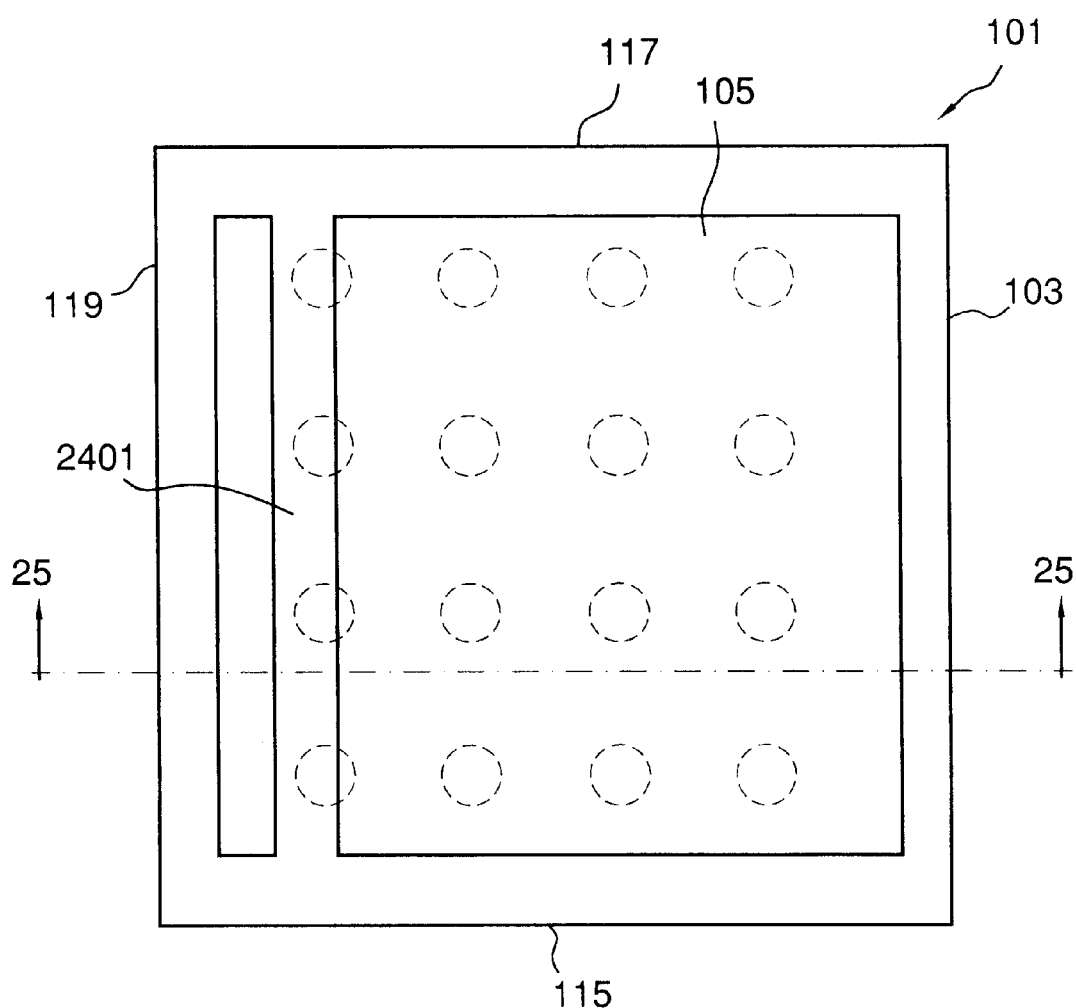
FIG. 24 is a plan perspective view showing the back of a semiconductor device 101 according to a third embodiment of the present invention.
Figure 25:
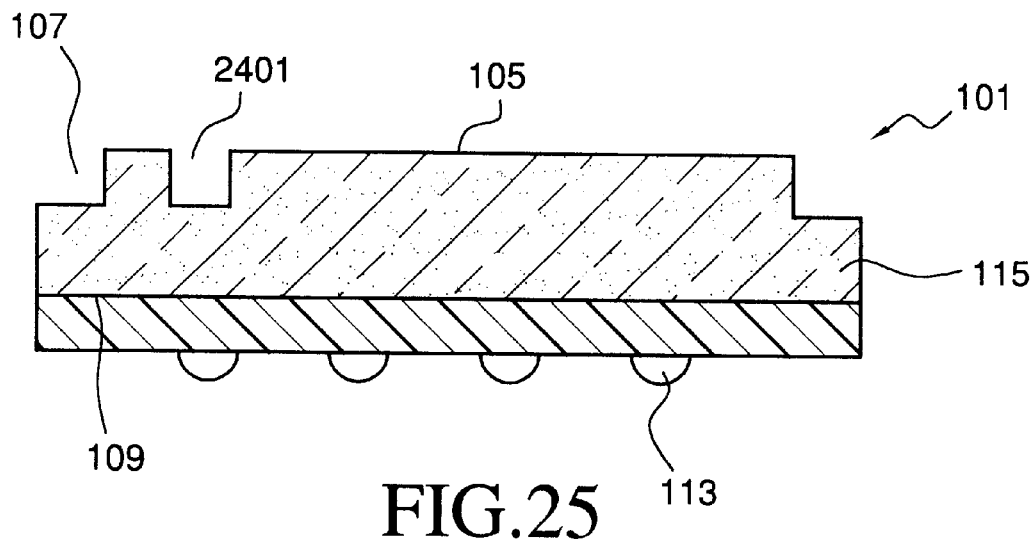
FIG. 25 is a schematic cross-sectional view taken along line 25—25 of FIG. 24.

FIG. 24 is a plan perspective view showing a third embodiment of a semiconductor device 101 according to the present invention, and FIG. 25 is a schematic cross-sectional view taken along line 25—25 of FIG. 24, respectively.

The third embodiment resides in that an additional steplike section 2401 is formed in a reverse side or back 105 of the semiconductor device 101 in addition to the steplike section 107 employed in the first embodiment. Since the third embodiment is substantially similar to the first embodiment in other configurations, the detailed description thereof will be omitted.

As shown in FIGS. 24 and 25, a semiconductor substrate 103 has a steplike section 107 (also called a "concave portion or trench portion") formed in a peripheral area (peripheral edge portion) of the back 105, and the additional steplike section 2401. The additional steplike section 2401 is a portion added to the first embodiment. The steplike section 2401 is formed within the back 105 so as to extend from a first side face 115 of the semiconductor substrate 103 to a second side face 117 opposite to the first side face 115. Further, the steplike section 2401 is formed in a central area of the back 105 in the neighborhood of a third side face 119. Here, the term of "the neighborhood of the third side face 119 at which the steplike section 2401 is formed" means a place located on the third side face 119 side as viewed from the center of the semiconductor substrate 103.

Figure 26:
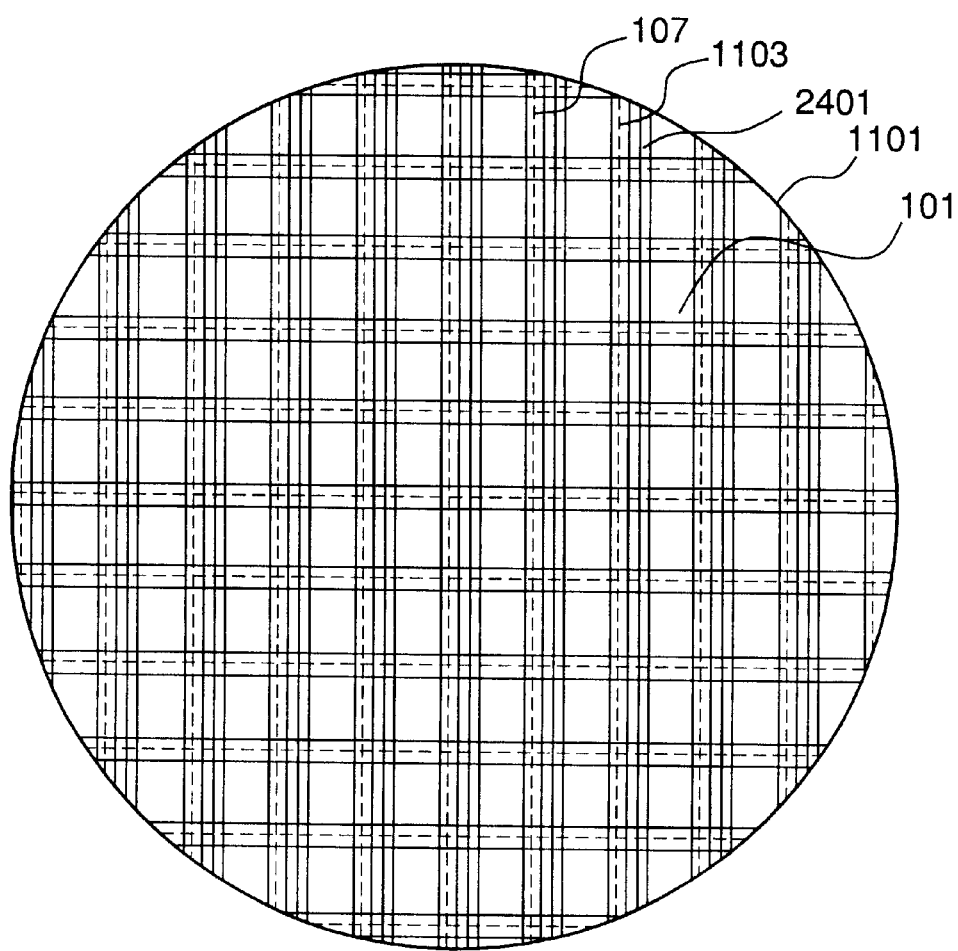
FIG. 26 is a diagram showing the reverse side of a semiconductor wafer 1101 used for semiconductor devices each showing the third embodiment of the present invention.

The additional steplike section 2401 can be formed by a first blade after the process step of FIG. 12(D). FIG. 26 is a diagram showing the back side of a semiconductor wafer 1101. It should be understood that the additional steplike sections 2401 formed by the first blade are formed in the neighborhood of the left sides of the respective semiconductor devices 101, i.e., in the neighborhood of the third side faces 119. Since the above-described forming method can easily be understood by those skilled in the art, the detailed description thereof will be omitted.

According to the semiconductor device showing the third embodiment of the present invention, it has the following peculiar effects in addition to the effects obtained by the semiconductor device according to the first embodiment. Namely, the additional steplike section 2401 formed in the back of the semiconductor substrate 103 can be utilized as one pin mark. Thus, the direction of each semiconductor device 101 can accurately be recognized in the process of accommodating each semiconductor device 101 in a tape & reel, the process of taking out it therefrom, and the process of mounting it to a printed circuit board. Incidentally, even if the recognizing work in the above processes is visually carried out by a human being, a similar effect can be obtained.

Incidentally, it will easily be estimated by those skilled in the art that the additional steplike section 2401 according to the present invention may be V-shaped or U-shaped.

An advantageous effect obtained by a typical semiconductor device of the inventions disclosed in the present application will be described in brief as follows:

According to the semiconductor device of the present invention, since a steplike section is provided in a peripheral area which surrounds a central area of a second main surface opposite to a first main surface with circuit elements formed thereon, it is possible to accurately carry out a visual inspection for determining whether the semiconductor device has accurately been placed on a printed circuit board. Further, the above-described steplike section can be formed in the process of bringing semiconductor devices into fractionalization. Thus, the above-described excellent semiconductor device can be fabricated without substantially adding a specific process for forming the steplike section.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a semiconductor substrate having a first main surface having circuit elements formed thereon, a second main surface substantially opposite to the first main surface, and a plurality of side faces provided between the first main surface and the second main surface, the circuit elements being connected to electrode pads;
   a plurality of external terminals formed over the first main surface; and
   a plurality of conductors electrically connecting the external terminals to the electrode pads,
   wherein the second main surface has a central area and a peripheral area which surrounds the central area, and a first steplike section is formed in the peripheral area, and
   wherein the first main surface has a peripheral area opposite the peripheral area of the second main surface, at least one of the electrode pads is disposed adjacent the peripheral area of the first main surface, and at least one of the conductors comprises a re-distribution conductor that extends laterally and connects the at least one of the electrode pads to an external terminal that is located inward of the peripheral area of the first main surface.

2. The semiconductor device according to claim 1, wherein the first steplike section has a predetermined width formed along the plurality of side faces.

3. The semiconductor device according to claim 1, wherein the first steplike section has a first portion having a first width formed along a first side face of the plurality of side faces, and a second portion having a second width which is formed along a second side opposite to the first side face and is narrower than the first width.

4. The semiconductor device according to claim 1, wherein the second main surface further has a second steplike portion which extends from a first side face of the plurality of side faces to a second side face of the plurality of side faces, which is opposite to the first side face.

5. The semiconductor device according to claim 1, wherein a sealing resin is disposed on the first main surface, and the external terminals are exposed from the surface of the sealing resin.

6. The semiconductor device according to claim 2, wherein a sealing resin is disposed on the first main surface, and the external terminals are exposed from the surface of the sealing resin.

7. The semiconductor device according to claim 3, wherein a sealing resin is disposed on the first main surface, and the external terminals are exposed from the surface of the sealing resin.

8. The semiconductor device according to claim 4, wherein a sealing resin is disposed on the first main surface, and the external terminals are exposed from the surface of the sealing resin.

9. A semiconductor device comprising:
   a semiconductor substrate having a first main surface having circuit elements formed thereon, a second main surface substantially opposite to the first main surface, and a plurality of side faces provided between the first main surface and the second main surface, the circuit elements being connected to electrode pads;
   a plurality of external terminals formed over the first main surface; and
   a plurality of conductors electrically connecting the external terminals to the electrode pads,
   wherein the second main surface has a central area and a peripheral area which surrounds the central area, the central area of the first main surface is disposed a first distance from the second main surface, the peripheral area of the first main surface is disposed a second distance from the second main surface, and the second distance is shorter than the first distance, and
   wherein the first main surface has a peripheral area opposite the peripheral area of the second main surface, at least one of the electrode pads is disposed adjacent the peripheral area of the first main surface, and at least one of the conductors comprises a re-distribution conductor that extends laterally and connects the at least one of the electrode pads to an external terminal that is located inward of the peripheral area of the first main surface.

10. The semiconductor device according to claim 9, wherein the side faces of the semiconductor chip include a first side face and a second side face that is disposed opposite the first side face, the peripheral area has a first width from the first side face to the central area, the peripheral area has a second width from the second side face to the central area, and the second width is smaller than the first width.

11. The semiconductor device according to claim 9, wherein the second distance, from the first main surface to the second main surface in the peripheral area, becomes gradually smaller from the central area to the respective side faces.

12. The semiconductor device according to claim 9, wherein a predetermined portion of the central area has a steplike section where the distance from the first main surface to the second main surface substantially corresponds to the second distance.

13. The semiconductor device according to claim 9, wherein a sealing resin is disposed on the first main surface, and the external terminals are exposed from the surface of the sealing resin.

14. The semiconductor device according to claim 10, wherein a sealing resin is disposed on the first main surface, and the external terminals are exposed from the surface of the sealing resin.

15. The semiconductor device according to claim 11, wherein a sealing resin is disposed on the first main surface, and the external terminals are exposed from the surface of the sealing resin.

16. The semiconductor device according to claim 12, wherein a sealing resin is disposed on the first main surface, and the external terminals are exposed from the surface of the sealing resin.

17. A semiconductor device comprising:
a semiconductor substrate having a first main surface having circuit elements formed thereon, a second main surface substantially opposite to the first main surface, and a plurality of side faces provided between the first main surface and the second main surface, the circuit elements being connected to electrode pads;
a plurality of external terminals formed over the first main surface; and
a plurality of conductors electrically connecting the external terminals to the electrode pads,
wherein the second main surface has a central area and a peripheral area which surrounds the central area, and the peripheral area is rougher than the second main surface in the central area, and
wherein the first main surface has a peripheral area opposite the peripheral area of the second main surface, at least one of the electrode pads is disposed adjacent the peripheral area of the first main surface, and at least one of the conductors comprises a re-distribution conductor that extends laterally and connects the at least one of the electrode pads to an external terminal that is disposed inward of the peripheral area of the first main surface.

18. The semiconductor device according to claim 17, wherein a predetermined portion of the central area is rougher than other portions of the central area.

19. The semiconductor device according to claim 17, wherein a sealing resin is disposed on the first main surface and the external terminals are exposed from the surface of the sealing resin.

20. The semiconductor device according to claim 18, wherein a sealing resin is disposed on the first main surface and the external terminals are exposed from the surface of the sealing resin.

21. A semiconductor device comprising:
a semiconductor substrate having a first main surface having circuit elements formed thereon, a second main surface substantially opposite to the first main surface, and a plurality of side faces provided between the first main surface and the second main surface, the circuit elements being connected to electrode pads;
a plurality of external terminals formed over the first main surface; and
a plurality of conductors electrically connecting the external terminals to the electrode pads,
wherein the second main surface has a central area and a peripheral area which surrounds the central area, a steplike section is formed in the peripheral area, and the thickness of the semiconductor substrate is a first thickness in the central area, and a second thickness that is smaller than the first thickness in the peripheral area, and
wherein the first main surface has a peripheral area opposite the peripheral area of the second main surface, at least one of the electrode pads is disposed adjacent the peripheral area of the first main surface, and at least one of the conductors comprises a re-distribution conductor that extends laterally and connects the at least one of the electrode pads to an external terminal that is located inward of the peripheral area of the first main surface.

22. The semiconductor device according to claim 21, wherein the thickness of the semiconductor substrate corresponds to the second thickness in a first area from a first side face of the plurality of side faces to the central area and corresponds to the second thickness in a second area which extends from a second side face, opposite to the first side face, of the plurality of side faces to the central area and is narrower than the first area.

23. The semiconductor device according to claim 21, wherein the thickness of the semiconductor substrate in the peripheral area becomes gradually smaller from the central area to the respective side faces.

24. The semiconductor device according to claim 21, wherein the thickness of the semiconductor substrate in a predetermined portion of the central area substantially corresponds to the second thickness.

25. The semiconductor device according to claim 21, wherein a sealing resin is disposed on the first main surface, and the external terminals are exposed from the surface of the sealing resin.

26. The semiconductor device according to claim 22, wherein a sealing resin is disposed on the first main surface, and the external terminals are exposed from the surface of the sealing resin.

27. The semiconductor device according to claim 23, wherein a sealing resin is disposed on the first main surface, and the external terminals are exposed from the surface of the sealing resin.

28. The semiconductor device according to claim 24, wherein a sealing resin is disposed on the first main surface, and the external terminals are exposed from the surface of the sealing resin.

29. The semiconductor device according to claim 1, wherein the semiconductor substrate has an outer edge and the first steplike section extends inward from the outer edge.

30. The semiconductor device according to claim 9, wherein the semiconductor substrate has an outer edge and the peripheral area extends inward from the outer edge.

31. The semiconductor device according to claim 17, wherein the semiconductor substrate has an outer edge, and the peripheral area extends inward from the outer edge.

32. The semiconductor device according to claim 21, wherein the semiconductor substrate has an outer edge, the peripheral area extends inward from the outer edge, and the peripheral area has the second thickness at the outer edge.

33. A semiconductor device comprising:
a rectangular semiconductor substrate having a first main surface with circuit elements formed thereon, a second main surface substantially opposite to the first main surface, and four side faces between the first and second main surfaces, the second main surface having an elongated first recessed portion along a first one of the side faces and also having an elongated second recessed portion along a second one of the side faces, the second one of the side faces being disposed opposite the first one of the side faces, the first recessed portion having a predetermined width and the second recessed portion having a width that is substantially greater than the width of the first recessed portion;

a layer of sealing resin covering the first main surface;

electrodes that protrude from the sealing resin; and conductors connecting the circuit elements to the electrodes.

34. The semiconductor device according to claim 33, wherein one of the circuit elements is a connected to an electrode pad that is disposed adjacent the first one of the side faces, and one of the conductors comprises an elongated re-distribution conductor that is connected to the electrode pad and that extends away from the first one of the side faces.

35. The semiconductor device according to claim 34, wherein the first and second recessed portions are roughened and substantially all of the rest of the second main surface is polished.

* * * * *